(12) United States Patent
Kang et al.

(10) Patent No.: US 8,835,995 B2
(45) Date of Patent: Sep. 16, 2014

(54) SEMICONDUCTOR DEVICES INCLUDING SILICIDE REGIONS AND METHODS OF FABRICATING THE SAME

(75) Inventors: Sungkwan Kang, Seoul (KR); Keum Seok Park, Gwangmyeong-si (KR); Byeongchan Lee, Yongin-si (KR); Sangbom Kang, Seoul (KR); Nam-Kyu Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 568 days.

(21) Appl. No.: 13/155,483

(22) Filed: Jun. 8, 2011

(65) Prior Publication Data
US 2012/0056245 A1 Mar. 8, 2012

(30) Foreign Application Priority Data
Sep. 7, 2010 (KR) .................. 10-2010-0087618

(51) Int. Cl.
- *H01L 21/8234* (2006.01)
- *H01L 21/44* (2006.01)
- *H01L 29/78* (2006.01)
- *H01L 21/02* (2006.01)
- *H01L 21/8238* (2006.01)
- *H01L 21/40* (2006.01)
- *H01L 29/66* (2006.01)

(52) U.S. Cl.
CPC .... *H01L 21/823814* (2013.01); *H01L 29/7848* (2013.01); *H01L 29/665* (2013.01); *H01L 21/02532* (2013.01); *H01L 21/0262* (2013.01); *H01L 21/823807* (2013.01); *H01L 29/66636* (2013.01); *H01L 21/02639* (2013.01); *H01L 29/66628* (2013.01); *H01L 29/66545* (2013.01); *H01L 21/0245* (2013.01)

USPC .................. 257/288; 257/384; 257/E21.092; 257/E21.093; 257/E21.431; 257/E21.439; 257/E21.619; 438/300; 438/664

(58) Field of Classification Search
CPC .................. H01L 21/0245; H01L 21/823814; H01L 29/66507; H01L 29/66636; H01L 29/7848
USPC .................. 257/E21.092–E21.093, 257/E21.43–E21.439, E21.619, E21.634, 257/288, 368, 382, 384, 401; 438/300, 607, 438/581, 583, 630, 649, 651, 655, 664, 682
See application file for complete search history.

(56) References Cited

U.S. PATENT DOCUMENTS

| | | | |
|---|---|---|---|
| 7,355,262 B2 * | 4/2008 | Ko et al. ......................... | 257/506 |
| 7,390,707 B2 * | 6/2008 | Kawamura et al. ............ | 438/197 |

(Continued)

FOREIGN PATENT DOCUMENTS

| | | |
|---|---|---|
| JP | 2007-036205 | 2/2007 |
| JP | 2008-071890 | 3/2008 |

(Continued)

*Primary Examiner* — Laura Menz
*Assistant Examiner* — Maliheh Malek
(74) *Attorney, Agent, or Firm* — Volentine & Whitt, PLLC

(57) ABSTRACT

A semiconductor device includes a semiconductor substrate, a gate electrode structure including a gate electrode located on an active region of the semiconductor substrate, first and second epitaxial regions located in the active region at opposite sides of the gate electrode structure, and first and second silicide layers on upper surfaces of the first and second epitaxial regions, respectively. The first and second epitaxial regions include Si—X, where X is one of germanium and carbon, and at least a portion of each of the first and second silicide layers is devoid of X and includes Si—Y, where Y is a metal or metal alloy.

17 Claims, 29 Drawing Sheets

(56) References Cited

U.S. PATENT DOCUMENTS

| | | | |
|---|---|---|---|
| 7,524,716 B2 * | 4/2009 | Ting et al. | 438/197 |
| 7,718,500 B2 * | 5/2010 | Chong et al. | 438/300 |
| 7,875,521 B2 * | 1/2011 | Shimamune et al. | 438/300 |
| 7,939,413 B2 * | 5/2011 | Chong et al. | 438/300 |
| 8,076,239 B2 * | 12/2011 | Kawamura et al. | 438/672 |
| 8,247,284 B2 * | 8/2012 | Tamura | 438/199 |
| 8,258,576 B2 * | 9/2012 | Ohta | 257/351 |
| 8,344,455 B2 * | 1/2013 | Oosuka et al. | 257/350 |
| 8,404,546 B2 * | 3/2013 | Woon et al. | 438/285 |
| 8,586,438 B2 * | 11/2013 | Tamura et al. | 438/285 |
| 8,673,724 B2 * | 3/2014 | Park et al. | 438/300 |
| 2002/0008261 A1 * | 1/2002 | Nishiyama | 257/288 |
| 2005/0112817 A1 * | 5/2005 | Cheng et al. | 438/219 |
| 2006/0270133 A1 * | 11/2006 | Yasutake | 438/197 |
| 2007/0122986 A1 * | 5/2007 | Sandhu | 438/301 |
| 2007/0132038 A1 * | 6/2007 | Chong et al. | 257/401 |
| 2007/0190730 A1 * | 8/2007 | Huang et al. | 438/299 |
| 2008/0099846 A1 * | 5/2008 | Ohta | 257/351 |
| 2008/0157224 A1 * | 7/2008 | Fischer et al. | 257/401 |
| 2008/0164491 A1 * | 7/2008 | Liu et al. | 257/190 |
| 2008/0251851 A1 * | 10/2008 | Pan et al. | 257/369 |
| 2008/0265417 A1 * | 10/2008 | Kawamura et al. | 257/751 |
| 2009/0001420 A1 * | 1/2009 | Matsumoto | 257/190 |
| 2009/0230480 A1 * | 9/2009 | Shifren et al. | 257/369 |
| 2009/0280612 A1 * | 11/2009 | Shimamune et al. | 438/300 |
| 2010/0197092 A1 * | 8/2010 | Kim et al. | 438/229 |
| 2010/0311218 A1 * | 12/2010 | Fukutome et al. | 438/300 |
| 2010/0327329 A1 * | 12/2010 | Itokawa | 257/255 |
| 2011/0001170 A1 * | 1/2011 | Ito et al. | 257/255 |
| 2011/0117679 A1 * | 5/2011 | Lee et al. | 438/5 |
| 2011/0230027 A1 * | 9/2011 | Kim et al. | 438/285 |
| 2011/0263092 A1 * | 10/2011 | Cheng et al. | 438/300 |
| 2011/0312145 A1 * | 12/2011 | Tsai et al. | 438/300 |
| 2012/0045878 A1 * | 2/2012 | Tamura | 438/285 |
| 2012/0112290 A1 * | 5/2012 | Utomo et al. | 257/369 |
| 2012/0241816 A1 * | 9/2012 | Flachowsky et al. | 257/192 |
| 2012/0292637 A1 * | 11/2012 | Beyer et al. | 257/77 |
| 2013/0020612 A1 * | 1/2013 | Wann et al. | 257/190 |
| 2013/0045589 A1 * | 2/2013 | Kim et al. | 438/478 |
| 2013/0248999 A1 * | 9/2013 | Glass et al. | 257/335 |
| 2013/0280897 A1 * | 10/2013 | Tamura | 438/527 |
| 2013/0316525 A1 * | 11/2013 | Son et al. | 438/591 |
| 2013/0323899 A1 * | 12/2013 | Wang et al. | 438/303 |

FOREIGN PATENT DOCUMENTS

| | | |
|---|---|---|
| JP | 2009-302317 | 12/2009 |
| KR | 1020060134772 | 12/2006 |

* cited by examiner

SEMICONDUCTOR DEVICES INCLUDING SILICIDE REGIONS AND METHODS OF FABRICATING THE SAME

PRIORITY STATEMENT

A claim of priority under 35 U.S.C. §119 is made to Korean Patent Application No. 10-2010-0087618, filed on Sep. 7, 2010, the disclosure of which is incorporated herein in its entirety.

BACKGROUND

The inventive concepts relate to a semiconductor devices and to methods of fabricating the same. More particularly, the inventive concepts relate to semiconductor devices including silicide regions and to methods of fabricating the same.

A semiconductor device may include an integrated circuit (IC) made up of a plurality of Metal Oxide Semiconductor Field Effect Transistors (MOSFETs or MOS transistors for short). Reducing the size and design rule of such a semiconductor device, i.e., increasing the degree of integration of the device, may thus require a scaling-down of MOS transistors. However, scaled-down MOS transistors may exhibit short channel effects which degrade the operational characteristics of the semiconductor device. Accordingly, research is being conducted on various techniques aimed at fabricating highly integrated semiconductor devices that offer better performance. In particular, research is being conducted on ways to increase the mobility of charge carriers (electrons or holes) in MOS transistors with the aim of developing high-performance semiconductor devices. Also, research is being conducted on ways to form low-resistivity silicide layers in MOS transistors, which can minimize contact resistance and sheet resistance of the gate, source and drain of MOS transistors, and thereby allow for the production of more highly integrated semiconductor devices.

SUMMARY

According to one aspect of the inventive concepts, a semiconductor device is provided which includes a semiconductor substrate, a gate electrode structure including a gate electrode located on an active region of the semiconductor substrate, first and second epitaxial regions located in the active region at opposite sides of the gate electrode structure, and first and second silicide layers on upper surfaces of the first and second epitaxial regions, respectively. The first and second epitaxial regions include Si—X, where X is one of germanium and carbon, and at least a portion of each of the first and second silicide layers is devoid of X and includes Si—Y, where Y is a metal or metal alloy.

According to another aspect of the inventive concepts, a semiconductor device is provided which includes a substrate including a first region and a second region, a device isolation layer in the substrate and which demarcates a first active region in the first region of the substrate and a second active region in the second region of the substrate, a PMOS transistor disposed at the first region of the substrate and including a first gate electrode located on the first active region, first and second epitaxial regions located in the first active region at opposite sides of the first gate electrode, respectively, where the first and second epitaxial regions both include SiGe. The semiconductor device further includes first and second silicide layers on upper surfaces of the first and second epitaxial regions, respectively, wherein at least a portion of each of the first and second silicide layers is devoid of germanium and includes Si—Y, where Y is a metal or metal alloy. The semiconductor device still further includes an NMOS transistor disposed at the second region of the substrate and electrically connected to the PMOS.

According to another aspect of the inventive concepts, a method of fabricating a semiconductor device is provided which includes forming a gate electrode structure including a gate electrode on an active region of a substrate, forming first and second epitaxial regions in the active region at opposite sides of the gate electrode structure, respectively, forming a silicon layer on the first and second epitaxial regions including by depositing silicon on each of the first and second epitaxial regions, and converting at least a portion of the silicon layer, on each of the first and second epitaxial regions, to a silicide.

BRIEF DESCRIPTION OF THE DRAWINGS

These and other aspects and features of the inventive concepts will become readily understood from the detailed description that follows, with reference to the accompanying drawings, in which.

DETAILED DESCRIPTION OF EMBODIMENTS

Figure 1:
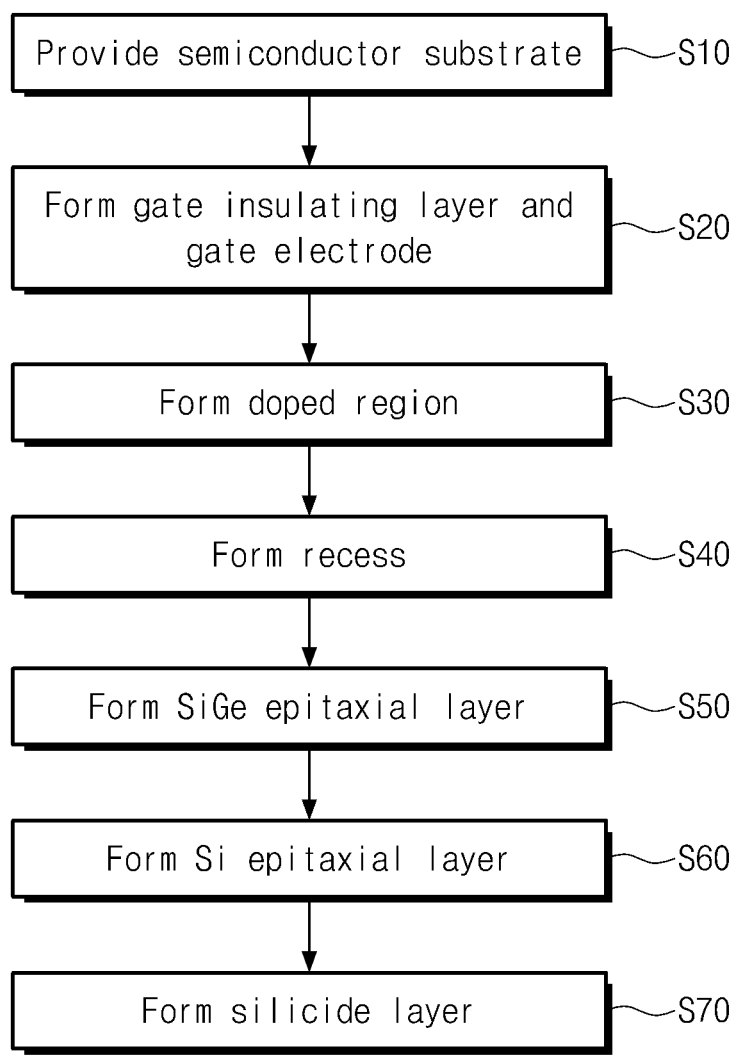
FIG. 1 is a flow chart of a first embodiment of a method of fabricating a semiconductor device according to the inventive concepts.

Various embodiments and examples of embodiments of the inventive concept will be described more fully hereinafter with reference to the accompanying drawings. In the drawings, the sizes and relative sizes and shapes of elements, layers and regions, such as implanted or etched regions, shown in section may be exaggerated for clarity. In particular, the cross-sectional illustrations of the semiconductor devices and intermediate structures fabricated during the course of their manufacture are schematic. Also, when like numerals appear in the drawings, such numerals are used to designate like elements.

Furthermore, spatially relative terms, such as "upper", "top", "lower" and "bottom" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, a term such as "upper" or "bottom" as used to describe a surface generally refers not only to the orientation depicted in the drawings but may refer to the fact that the surface is the uppermost or bottommost surface in the orientation depicted, as would be clear from the drawings and context of the written description.

It will also be understood that when an element or layer is referred to as being "on" another element or layer, it can be directly on the other element or layer or intervening elements or layers may be present. In contrast, when an element or layer is referred to as being "directly on" another element or layer, there are no intervening elements or layers present.

Furthermore, the term "and/or" as used herein includes any and all practical combinations of one or more of the associated listed items. With respect to materials of a particular layer, the term "and/or" may be used to indicate that the particular layer is made up of one or more films of different materials.

It will also be understood that although the terms first, second, third, etc. are used herein to describe various elements, regions, layers, etc., these elements, regions, and/or layers are not limited by these terms. These terms are only used to distinguish one element, layer or region from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Also, in the description that follows, conventional notation known in the art of crystallography as Miller indices will be used. Miller indices, as is known in the art, indicate the arrangement of atoms in a crystalline solid. More specifically, Miller indices describe arrangements of atoms in a crystalline solid in terms of directions and planes in a crystal lattice.

Miller indices are sets of three integers h, k and l that describe a family of planes in a crystal lattice. The integers are written in their lowest terms, i.e., as their minimum integer ratio such that their greatest common divisor is 1. When the three integers are arranged in ( ) like (h k l), the index denotes the reciprocals of intercepts of the plane in a coordinate system of a unit cell of the crystal lattice. This plane could be any one of planes parallel to each other in the lattice. Furthermore, many planes in the lattice are equivalent to each other in a crystallographic sense. Therefore, the notation {h k l} is used to denote the set of planes that are equivalent to (h k l) by the symmetry of the lattice.

Also, a direction in a crystal lattice is described by a set of three integers representing a vector in that direction between two points in the unit cell of the crystal lattice. The vector is denoted by [h k l] with the integers being the intercepts of the vector when projected onto the crystallographic axes of a unit cell of the lattice (and again reduced to the simplest whole number ratio). Similar to planes in a crystal lattice, many directions in the lattice are crystallographically equivalent to each other due to symmetry of the lattice. Therefore, the notation <h k l> describes the set of directions that are equivalent to direction [h k l] by symmetry.

Finally, before the detailed description of the preferred embodiments proceeds, an aspect of a PMOS transistor to which embodiments of the inventive concepts applies will be described. A PMOS transistor formed on a semiconductor substrate includes a gate electrode disposed on the semiconductor substrate, a gate insulating layer interposed between the gate electrode and the substrate, and source/drain electrodes disposed in the semiconductor substrate at both sides of the gate electrode. When a predetermined bias voltage is applied to the PMOS transistor, a channel is formed in the semiconductor substrate under the gate electrode. Holes serving as major charge carriers in the PMOS transistor move through the channel. The mobility of holes in the channel is a factor in the speed of operation of the PMOS. Thus, operating characteristics of the PMOS transistor can be improved by increasing the mobility of the holes.

In general, the mobility of charge carriers can be improved by applying physical stress to the channel region beneath the gate electrode to thereby change the energy band structure of the channel region. In the case of a PMOS transistor having holes as major charge carriers, a compressive stress when applied to the channel region can improve the mobility of holes. Also, the mobility of the charge carriers is affected by the orientation of the crystal lattice of the semiconductor substrate. For example, holes serving as major charge carriers in a PMOS transistor have high mobility in the <110> directions of a silicon lattice.

Therefore, a channel region of the PMOS transistor is formed so as to extend lengthwise in one of the <110> directions.

A first embodiment of a semiconductor device and a method of fabricating the same will now be described with reference to FIGS. 1-10

Figure 2:
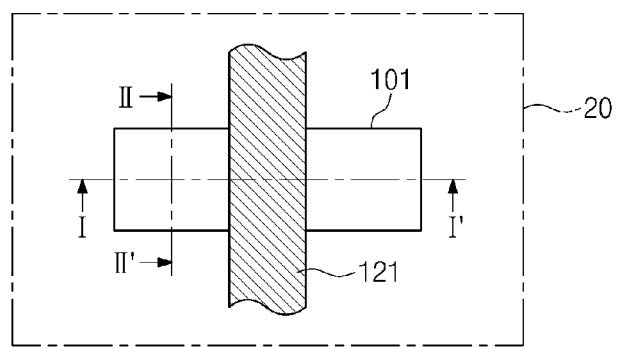
FIG. 2 is a plan view of a semiconductor device according to the inventive concepts.
Figure 3:
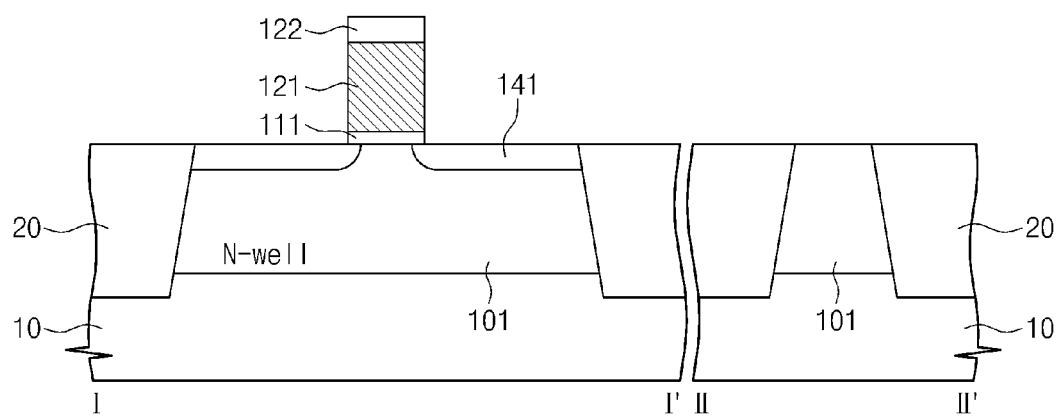
FIGS. 3 to 10 are each sectional views in the directions of lines I-I' and II-II' of FIG. 2, respectively, and together illustrate the first embodiment of a method of fabricating a semiconductor device according to the inventive concepts.

Referring first to FIGS. 1, 2 and 3, a semiconductor substrate 10 having an active region delimited by a device isolation layer 20 is provided (S10).

The semiconductor substrate 10 may be a monocrystalline silicon substrate. Alternatively, as other examples, the semiconductor substrate 10 may be a silicon-on-insulator (SOI) substrate, a germanium substrate, a germanium-on-insulator (GOI) substrate, a silicon-germanium substrate, or an epitaxial layer substrate produced by a selective epitaxial growth (SEG) process. In the example of this embodiment that follows, the semiconductor substrate 10 is a silicon substrate.

The device isolation layer 20 is formed by forming a trench in the semiconductor substrate 10 and filling the trench with a dielectric material. In this process, the trench can be formed by forming a mask (not illustrated) exposing a field region of the semiconductor substrate 10 and anisotropically etching the substrate using the mask as an etch mask. As a result of the anisotropic etching, the top of the trench is generally wider than its bottom. The trench is preferably filled with a dielectric having good gap-filling characteristics. Examples of dielectric material having good gap-filling characteristics include boron-phosphor silicate glass (BPSG), high-density plasma oxides, undoped silicate glass (USG), and Tonen Sila-Zene (TOSZ).

Also, the semiconductor substrate 10 may include a doped region 101. In particular, the semiconductor substrate 10 may include a doped region forming an n-type well (hereinafter also referred to as an N-well).

Subsequently, a gate insulator 111 and a gate electrode 121 are formed on the active region with the gate insulator 111 interposed between the gate electrode 121 and the active region (S20).

The gate insulator 111 may, for example, include a silicon oxide layer, a silicon nitride layer, a silicon oxynitride layer and a high-k dielectric layer, or a combination of such layers. Here, high-k dielectric refers to those materials whose dielectric constant is greater than that of silicon oxide. Examples of high-k dielectrics include tantalum oxide, titanium oxide, hafnium oxide, zirconium oxide, aluminum oxide, yttrium oxide, niobium oxide, cesium oxide, indium oxide, iridium oxide, and barium strontium titanate (BST).

The gate electrode 121 can be formed by forming a gate conductive layer and a capping layer on the gate insulator 111, and patterning (etching) the resulting structure. That is, the gate electrode 121 may include a gate conductive pattern 121 and a capping pattern 123 on the gate conductive pattern 121. The gate electrode 121 may also extend longitudinally on the active region in one of the <110> directions or the <100> directions of the crystal lattice of the silicon substrate 10.

In one example of this embodiment, the gate electrode 121 is formed of doped polysilicon (poly-Si), i.e., polysilicon doped with an n-type or p-type dopant. Thus, in the case in which a PMOS transistor is formed, the gate electrode 121 may be formed of a polysilicon layer doped with a p-type dopant. In another example of this embodiment, the gate electrode 121 is formed of conductive material that has a lower resistivity and a higher work function than doped polysilicon. For example, the gate electrode 121 may be formed of a metal layer and/or a metal nitride layer. Examples of the metal layers include tungsten and molybdenum layers and examples of conductive metal nitride layers include titanium nitride, tantalum nitride, tungsten nitride, and titanium aluminum nitride layers.

Next, doped regions are formed in the active region at both sides of the gate electrode 121 (S30). In an example of this embodiment, each doped region includes a lightly-doped region 141 and a heavily-doped region 143 (described below with reference to FIG. 4). The lightly-doped regions 141 are formed in the semiconductor substrate 10 at both sides of the gate electrode 121 by implanting a p-type dopant (e.g., boron (B)) using the gate electrode 121 as an ion implantation mask. In this case, diffusion of the dopant causes the lightly-doped region 141 to extend to a location beneath the gate electrode 121.

Also, a channel doped region (not illustrated) may be formed by performing a halo ion implantation process after the p-type lightly-doped region 141 is formed. Such a channel doped region may be formed by ion-implanting an n-type dopant (e.g., arsenic (As)), i.e., a dopant of a conductivity type opposite to the conductivity type of the source/drain region. The n-type channel doped region increases the ion concentration of the active region under the gate electrode 121, thus preventing a punch-through phenomenon.

Figure 4:
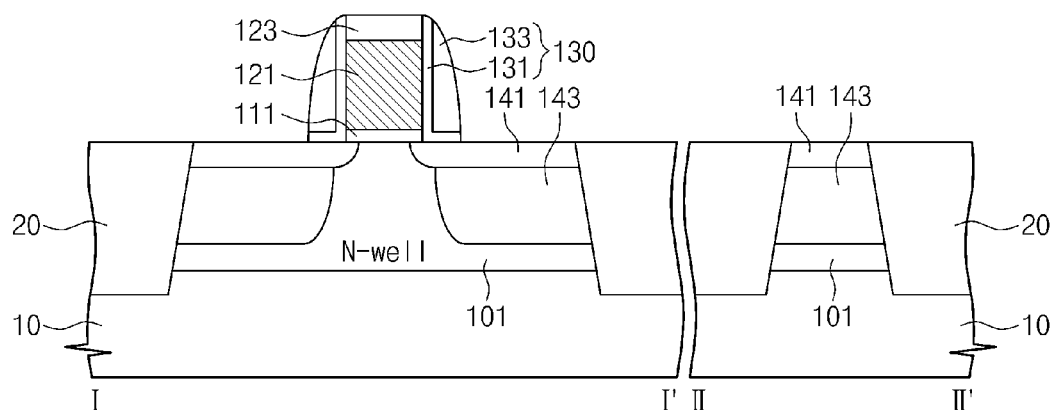

Referring to FIGS. 1, 2 and 4, a spacer 130 is formed on the sidewall of the gate electrode 121 (at both sides of the gate electrode as shown in the figure). In this respect, the spacer 130 may be formed by depositing dielectric material on the semiconductor substrate 10 and performing a blanket anisotropic etching process (e.g., an etch-back process) on the resulting structure.

In the illustrated example, the spacer 130 has a structure of stacked dielectric materials having an etch selectivity with respect to one another. More specifically, a silicon oxide layer and a silicon nitride layer are sequentially and conformally formed on the semiconductor substrate 10. The silicon oxide layer can be formed by a chemical vapor deposition (CVD) process or can be formed by thermally oxidizing the gate electrode 121 and the semiconductor substrate 10. The silicon oxide layer cures the sidewall of damage caused when the gate electrode 121 is formed by the aforementioned patterning (etching) process, and serves as a buffer layer between the semiconductor substrate 10 and the silicon nitride layer. The sequentially-formed silicon oxide layer and silicon nitride layer are then etched back to form a dual spacer 130 that includes an L-shaped lower spacer element 131 and an upper spacer element 133 on each side of the gate electrode 121. A dual spacer 130 hampers the creation of a short channel effect which tends to otherwise occur when the channel length (i.e., the distance between the source and drain regions) decreases with increases in the degree to which the semiconductor device is integrated.

The heavily-doped region 143 is formed on the semiconductor substrate 10 at both sides of the gate electrode 121 after the spacer 130 is formed. Also, the heavily-doped region 143 may be formed after a recess 105 (described below with reference to FIG. 5) has been formed. In any case, the heavily-doped region 143 may be formed by implanting a p-type dopant (e.g., boron (B)) using the gate electrode 121 and the spacer 130 as an ion implantation mask. In this case as well, the p-type heavily-doped region 143 may extend to a location under the spacer 130.

Figure 5:
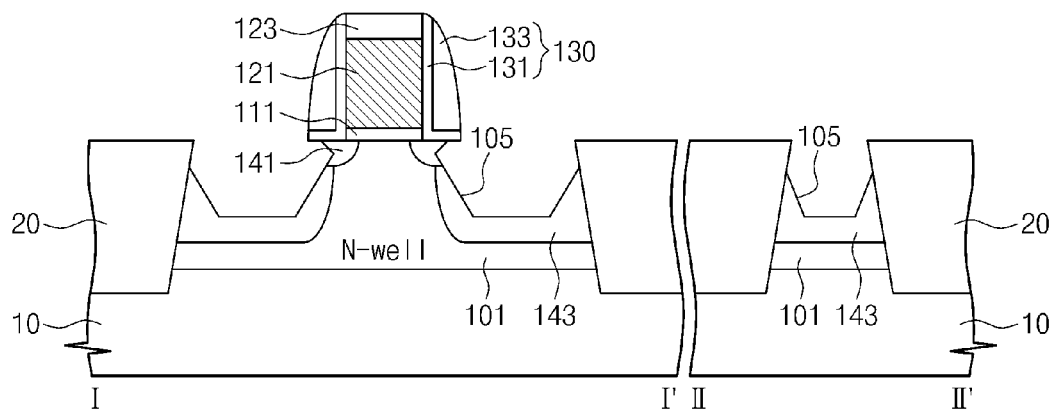

Referring to FIGS. 1, 2 and 5, after spacer 130 has been formed, the semiconductor substrate 10 is selectively etched to form a recess 105 at opposite sides of the gate electrode 121, respectively (S40). In the illustrated example of this embodiment, the bottom of the recess 105 is parallel to the upper surface of or plane of the semiconductor substrate 10. Also, the first and second sides of the recess 105, adjacent the opposite sides of the gate electrode 121, respectively, are inclined with respect to the upper surface of the semiconductor substrate 10. If the lattice of the semiconductor substrate 10 is oriented such that the upper surface or plane thereof is a (100) plane of the lattice, the bottom surface delimiting the bottom of the recess 105 is a (100) plane and first and second sides surfaces delimiting the first and second sides of the recess 105, respectively, may be constituted by a (110), a (111) or a (311) plane. More generally speaking, first and second side surfaces of the substrate that respectively delimit the sides of recess 105 adjacent to the gate electrode 121 each subtend an angle of greater than 90° and less than 180° with respect to the surface that delimits the bottom of the recess

105. Thus, the recess 105 may extend under the gate electrode 121. The recess 105 may also expose sidewalls of the device isolation layer 20.

The recess 105 is formed by etching the substrate 10 using the gate electrode 121, the spacer 130 and the device isolation layer 20 as an etch mask. By way of example, the recess 105 may be formed to a depth of about 300 Å to about 1000 Å from the upper surface of the semiconductor substrate 10. Note, in this respect, the heavily-doped region 143 is formed to a depth predetermined to be greater than that of the recess 105. Therefore, the recess 105 exposes the lightly-doped or heavily-doped regions 141 and 143 without exposing the N-well or the underlying portion of the semiconductor substrate 10.

An example of a specific process that can be used to form an illustrated recess 105 will now be described.

First, a shallow trench is formed adjacent the sides of the gate electrode 121 by dry etching the substrate 10 (isotropically or anisotropically) using the gate electrode 121, the spacer 130 and the device isolation layer 20 as an etch mask. In this process, HCl, Cl$_2$ and H$_2$ may be used as etch gas.

Subsequently, the trench is expanded by isotropically etching the substrate, to complete the recess 105. In this isotropic etching process, an organic alkali etchant (e.g., tetra-methyl ammonium-hydroxide (TMAH)) or ammonium hydroxide (NH$_4$OH) is used as an etchant. As a result, the substrate 10 is etched not only in the vertical direction but also in the horizontal direction. Accordingly, a portion of the semiconductor substrate 10 under the spacer 130 is etched when the recess 105 is formed.

In particular, in the case in which the semiconductor substrate 10 is a silicon substrate and is wet etched using ammonium hydroxide (NH$_4$OH) as an etchant, the etching rate of the silicon substrate 111 is lowest in a horizontal direction and is highest in a vertical direction normal to the (100) plane. Accordingly, a respective (111) plane defining each side of the recess 105 adjacent the gate electrode 121 will be left. As a result, a tapered structure is located beneath the gate electrode 121 between the sides of the recess each delimited by a respective (111) plane, i.e., the structure has a wedge-shaped cross-sectional area.

Also, in this case, the etching processes may create surface defects within the recess 105. Accordingly, after the recess 105 has been formed, the substrate may be cleaned with O$_3$ and HF to remove any surface defects.

In another example, the recess adjacent the sides of the gate electrode 121 may be formed only by an anisotropic dry etching process. As a result, the bottom surface delimiting the bottom of the recess is parallel to the upper surface of the semiconductor substrate 10, and the first and second side surfaces delimiting the respective sides of the recess adjacent the gate electrode have an angle of a little more than 90° with respect to the bottom surface. More specifically, the bottom surface of the recess 105 may be a (100) plane and the first and second side surfaces may be constituted by a (110) plane or a (311) plane.

The recess adjacent the gate electrode 121 may also be formed by a chemical vapor etching (CVE) process. For example, the recess adjacent the gate electrode 121 may be formed by a CVE process using HCl and H$_2$ as etch gas.

Figure 6:
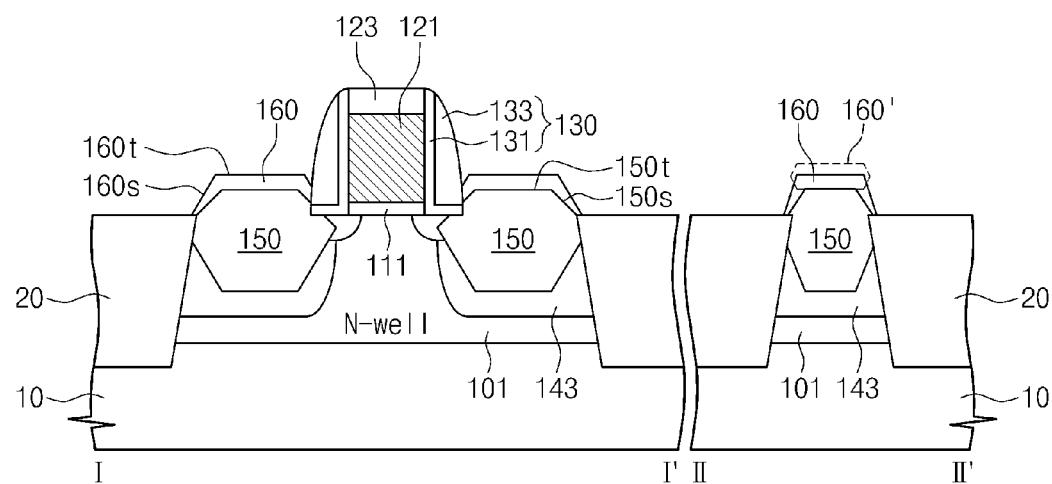

Referring to FIGS. 1, 2 and 6, a selective epitaxial growth (SEG) process is performed to form an SiGe epitaxial layer 150 in the recess 105 (S50). Note, at this time, the heavily-doped region 143, which surrounds the recess 105, isolates the epitaxial layer 150 with respect to the N-well of the semiconductor substrate 10.

The SEG process, as the name implies, allows for the SiGe epitaxial layer 150 to be selectively grown, in this case only on the surfaces of the semiconductor substrate 10 exposed by the recess 105, i.e., without being formed on the device isolation layer 20. The epitaxial layer formed in the recess 105 has the same crystalline structure as the semiconductor substrate 10 because the semiconductor substrate 10 serves as a seed layer in the SEG process.

According to the example of this embodiment in which the transistor being formed is a PMOS transistor, the silicon of the epitaxial layer is provided with germanium, through a doping process, to improve the performance of the PMOS transistor. Germanium has a lattice constant greater than that of the silicon of the semiconductor substrate 10. That is, in this embodiment, the layer formed in the recess 105 is of a semiconductor material that has a lattice constant greater than that of the semiconductor substrate 10 while having the same crystalline structure as the material of the semiconductor substrate 10. For example, the epitaxial layer may be formed of silicon germanium (Si$_{1-x}$Ge$_x$, x: 0.1~0.9), wherein the lattice constant of the silicon germanium is greater than the lattice constant of Si and less than the lattice constant of Ge.

As the silicon is doped, the Si atoms in the silicon lattice are replaced with the Ge atoms. Hence, the lattice expands because the lattice constant of Ge is greater than the lattice constant of Si. Accordingly, the SiGe epitaxial layer 150 imparts a compressive stress in the channel region of the PMOS transistor. The stress imparted to the channel region is especially great because the segments of the SiGe epitaxial layer 150 having portions located beneath the spacer 130 have a wedge-shaped profile. Furthermore, the compressive stress is also applied to the gate electrode 121.

The SEG process for forming the SiGe epitaxial layer 150*a* may be implemented using solid phase epitaxy (SPE), vapor phase epitaxy (VPE) and/or a liquid phase epitaxy (LPE). A chemical vapor deposition (CVD) process, a reduced pressure chemical vapor deposition (RPCVD) process or an ultra high vacuum chemical vapor deposition process may be used in the case in which the SEG process is carried out by VPE.

Also, in an example of the SEG process of this embodiment, the SiGe epitaxial layer 150 is formed by exposing the substrate 10 to silicon source gas, germanium source gas, and selective etch gas simultaneously. The silicon source gas may comprise monochlorosilane (SiH$_3$Cl), dichlorosilane (DCS), trichlorosilane (TCS), hexachlorosilane (HCS), SiH$_4$, Si$_2$H$_6$, or a combination thereof. The germanium source gas may comprise GeH$_4$, Ge$_2$H$_4$, GeH$_3$Cl, Ge$_2$H$_2$Cl$_2$, Ge$_3$HCl$_3$, or a combination thereof. The selective etch gas may comprise HCl, Cl$_2$, or a combination thereof. Also, carrier gas may be supplied together with the source gas to uniformly supply the source gas to the surface of the semiconductor substrate 10 during the selective epitaxial process. The carrier gas may include at least one of hydrogen, helium, nitrogen and argon. Also, the selective growth process may be performed at a temperature of at least about 550° C. or greater under a pressure of at least several mTorr.

In general, the growth rate of the SiGe epitaxial layer 150 depends on the ratio of the silicon source gas to the germanium source gas. Moreover, the rate at which the SiGe epitaxial layer 150 grows in a particular direction is dependent on the orientation of the underlying crystal plane of the Si seed layer. In this case, the SiGe epitaxial layer 150 grows significantly more quickly in the horizontal direction than in the vertical direction because the SiGe epitaxial layer 150 grows in the (100) direction of the lattice of the silicon substrate while hardly growing in the (110), (111) or (311) directions.

The compressive stress on the channel region is proportional to the thickness of the SiGe epitaxial layer 150. Thus, in this embodiment, as shown in FIG. 6, the SiGe epitaxial layer 150 is formed to project above the level of the upper surface of the active region of the semiconductor substrate 10. For example, the top surface 150t of the SiGe epitaxial layer 150 may be disposed above the level of the upper surface of the gate insulating layer 111. In an example of this embodiment, the top surface 150t of the SiGe epitaxial layer 150 is about 10 nm to about 40 nm above the upper surface of the active region of the semiconductor substrate 10. Thus, the SiGe epitaxial layer 150 imparts more compressive stress to the channel region than if it were formed flush with the upper surface of the active region.

Also, in an example of this embodiment, the upper portion of the SiGe epitaxial layer 150 has a higher concentration of Ge than its lower portion. The lower portion of the epitaxial layer 150, with its relatively low concentration of Ge, minimizes the lattice mismatch between the epitaxial layer 150 and the semiconductor substrate 10 formed of silicon. As an example of this, the lower portion of the epitaxial layer may have a thickness of about 20 nm to about 50 nm, and may have a Ge concentration of about 10% to about 30%, whereas the upper portion of the epitaxial layer may have a thickness of about 40 nm to about 60 nm, and may have a Ge concentration of about 20% to about 50%. In this way, a relatively great compressive stress can be applied to the channel region because the upper portion of the epitaxial layer 150 can have a high concentration of Ge.

The epitaxial layer 150 is also doped with a p-type dopant (e.g., boron (B)). The doping may be performed in situ, i.e., during the forming of the SiGe epitaxial layer 150. Alternatively, the p-type dopant may be ion-implanted after the SEG process has been performed. In any case, the p-type doped epitaxial layer constitutes a source/drain region of the PMOS transistor together with the lightly-doped and heavily-doped regions 141 and 143.

In the embodiment described above, the SiGe epitaxial layer 150 contacts the lightly-doped and heavily-doped regions 141 and 143. Accordingly, the p-type SiGe epitaxial layer 150, which has a small band gap, does not directly contact the N– well. Therefore, leakage current at the interface between the semiconductor substrate 10 and the SiGe epitaxial layer 150 is suppressed.

The resulting SiGe epitaxial layer 150 extends laterally toward the gate electrode 121. For example, the SiGe epitaxial layer 150 has a wedge-shaped portion that extends under the spacer 130. In particular, as described above, the growth rate of the SiGe epitaxial layer 150 differs amongst the directions in the SiGe lattice. Due to this characteristic of the SEG process, inclined surfaces 150s are produced in the portion of the SiGe epitaxial layer 150 which is formed above the upper surface of the substrate in the upper region. More specifically, the SiGe epitaxial layer 150 may have a bottom surface, and an upper portion having a top surface 150t and side surfaces 150s inclined relative to the top surface 150t.

In this case, the bottom surface and the top surface 150t of the SiGe epitaxial layer 150 are parallel to the upper surface of the active region of the semiconductor substrate 10. That is, if the upper surface of the active region of the semiconductor substrate 10 is a (100) plane of the crystal lattice, the bottom surface and the top surface 150t of the SiGe epitaxial layer 150 are planes parallel to the (100) plane. The inclined surfaces 150s of the SiGe epitaxial layer 150 subtend predetermined obtuse angles with respect to the bottom surface or the top surface 150t. For example, if the upper surface of the active region of the semiconductor substrate 10 is a (100) plane of the lattice, the inclined surfaces 150s may be parallel to a (111) plane, a (110) plane or a (311) plane.

Furthermore, although the inclined surfaces 150s are illustrated as being located entirely above the level of the upper surface of the active region of the semiconductor substrate 10, portions of the inclined surfaces 150s of the SiGe epitaxial layer 150 may extend under the upper surface of the active region. In this case, a groove may be formed between the device isolation layer 20 and the recess 105 to accommodate the lower ends of the inclined surface 150s of the SiGe epitaxial layer 150.

Referring still to FIGS. 1, 2 and 6, a selective epitaxial growth (SEG) process is performed to form an Si epitaxial layer 160 on the SiGe epitaxial layer 150 (S60).

The Si epitaxial layer 160 is grown only on the SiGe epitaxial layer 150, i.e., the Si epitaxial layer 160 is selectively grown, because it is formed using the SiGe epitaxial layer 150 as a seed layer. The Si epitaxial layer 160 may be formed in situ upon the completion of the process of forming the SiGe epitaxial layer 150.

Solid phase epitaxy (SPE), vapor phase epitaxy (VPE) and/or liquid phase epitaxy (LPE) may be used to form the Si epitaxial layer 160. In the case in which a VPE process is used as the SEG process for forming the Si epitaxial layer 160, the VPE can be realized by means of a chemical vapor deposition (CVD) process, a reduced pressure chemical vapor deposition (RPCVD) process or an ultra high vacuum chemical vapor deposition process.

The growth and etching rates of the Si material during the SEG process of forming Si epitaxial layer 160 differ amongst the respective crystal planes and directions of the underlying lattice. When an SEG process is used to form the Si epitaxial layer 160, the growth and etching rates of the Si epitaxial layer 160 may differ amongst different crystal planes constituting the surface of the underlying lattice. Specifically, the growth rate of the Si epitaxial layer 160 is highest on the (100) plane and lowest on the (111) plane, whereas the etching rate of the Si epitaxial layer 160 is lowest on the (100) plane and highest on the (110) plane. Accordingly, if the silicon source gas and the etch gas are simultaneously supplied to form the Si epitaxial layer 160, the layer grows mainly in the vertical direction from the top surface 150t of the SiGe epitaxial layer 150 (the (100) plane) and significantly less so from the inclined surface 150s of the SiGe epitaxial layer 150. Therefore, as illustrated in the drawings, an Si epitaxial layer 160' could very well be formed on only the top surface 150t of the SiGe epitaxial layer 150 while the inclined surfaces 150s of the SiGe epitaxial layer 150 remain exposed.

However, according to the first embodiment of the inventive concepts, the Si epitaxial layer 160 completely caps the portion of the SiGe epitaxial layer 150 that projects above the level of the upper surface of the semiconductor substrate 10. For instance, the Si epitaxial layer 160 covers the top surface 150t and the inclined surfaces 150s of the SiGe epitaxial layer 150. The Si epitaxial layer 160 is, for example, about 10 nm to about 30 nm thick on the top surface 150t of the SiGe epitaxial layer 150. Moreover, the Si epitaxial layer 160 is thicker on the top surface 150t of the SiGe epitaxial layer 150 than on the inclined surfaces 150s of the SiGe epitaxial layer 150. Also, the thickness of the Si epitaxial layer 160 may decrease toward the device isolation layer 20.

A technique of forming the Si epitaxial layer 160 so that it completely caps the exposed portion of the SiGe epitaxial layer 150 will be described later on in detail with reference to FIGS. 11 and 12 and FIGS. 13A to 13D.

Referring to FIGS. 1, 2, 7 and 8, silicide layers 171 and 173 are formed on the source/drain region and the gate electrode 121, respectively, after the Si epitaxial layer 160 has been formed (S70). In this example of the first embodiment, the gate electrode 121 is of doped polysilicon. Also, the proportion of the silicon and metal elements in the silicide layer 171 may be about 90% or more. Furthermore, as mentioned above, preferably, the Si epitaxial layer 160 completely caps the portion of the SiGe epitaxial layer 150 that projects above the level of the upper surface of the semiconductor substrate 10. In this case, it is possible to prevent the metal layer used for forming the silicide layer 171 from contacting the SiGe epitaxial layer 150. Also, it is possible to prevent the metal layer from infiltrating to the semiconductor substrate 10 along the interface between the device isolation layer 20 and the SiGe epitaxial layer 150 where the metal could react with the semiconductor substrate 10.

Figure 7:
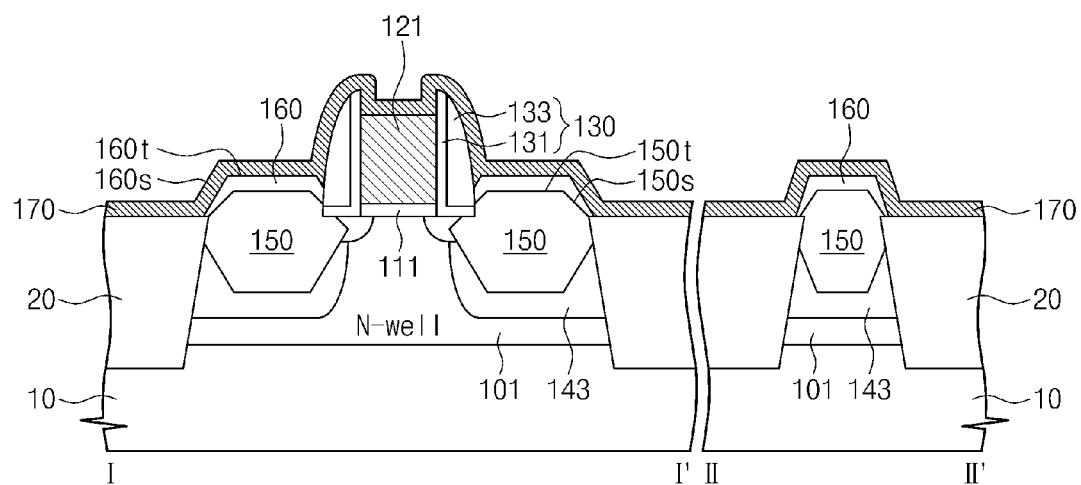

Referring to FIG. 7, first the capping pattern 123 on the gate electrode 121 is removed, and a metal layer 170 is conformally formed on the semiconductor substrate 10. Thus, the metal layer 170 covers the top surface of the gate electrode 121 and the surface of the Si epitaxial layer 160. The metal layer 170 may be formed of a refractory metal such as cobalt, titanium, nickel, tungsten or molybdenum.

Subsequently, a thermal treatment process is performed to cause the silicon of the Si epitaxial layer 160 and the gate electrode 121 to react with the metal of layer 170. In an exemplary embodiment, the thermal treatment process comprises heating the substrate at a temperature of about 250° C. to about 800° C. In this respect, a rapid thermal process (RTP) device or furnace may be used to execute the thermal treatment process.

As a result of the thermal treatment process, silicon of the gate electrode 121 and the Si epitaxial layer 160 is consumed and the silicide layers 171 and 173 are formed. That is, a portion or the entire Si epitaxial layer 160 may be converted into the silicide layer 171, and an upper portion of the gate electrode 173 is converted into the silicide layer 173. If the entire Si epitaxial layer 160 reacts with the metal layer 170, the silicide layer 171 contacts the top surface 150t and the inclined surfaces 150s of the SiGe epitaxial layer 150. Alternatively, if only a portion of the Si epitaxial layer 160 reacts with the metal layer 170, an Si epitaxial layer remains between the silicide layer 171 and the SiGe epitaxial layer 150. In any case, as illustrated in FIG. 8, silicide layer 171 is formed on the SiGe epitaxial layer 150 and silicide layer 173 is formed on the gate electrode 121.

Figure 8:
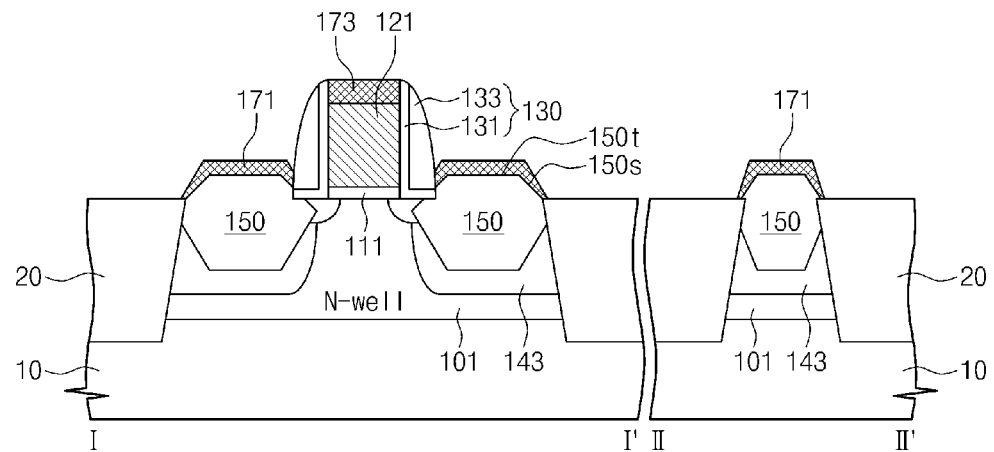

Thus, as can be seen in FIG. 8, first and second epitaxial regions comprising germanium are located in a surface of the active region of the substrate 10 on respective opposite sides of the gate electrode structure, first and second silicide layers 171 are located on the first and second epitaxial regions, respectively, and at least a portion of each of the first and second silicide layers 171 is devoid of germanium, and comprises silicon and either a metal or metal alloy.

According to an example of this embodiment, the metal layer 170 is a nickel layer, formed of pure nickel or a nickel alloy. In the case of nickel alloy, the metal layer 170 may contain at least one material selected from the group consisting of tantalum (Ta), zirconium (Zr), titanium (Ti), hafnium (Hf), tungsten (W), cobalt (Co), platinum (Pt), molybdenum (Mo), palladium (Pd), vanadium (V) and niobium (Nb).

Now, if the Si epitaxial layer had been locally formed only on the top surface 150t of the SiGe epitaxial layer 150 (as was described with reference to FIG. 6 vis-à-vis layer 160'), the metal layer 170 would directly cover the inclined surfaces 150s of the SiGe epitaxial layer 150. If the metal layer were formed of nickel, the nickel would react with the silicon substrate 10 at the interface between the device isolation layer 20 and the SiGe epitaxial layer 150 during the thermal treatment process because the reaction rate of silicon and nickel is higher than the reaction rate of silicon germanium and nickel. Accordingly, the resulting nickel silicide layer would encroach upon the semiconductor substrate 10 adjacent to the SiGe epitaxial layer 150. The nickel silicide layer would thus facilitate junction leakage current and thereby degrade the breakdown voltage characteristics of the PMOS transistor.

However, according to an aspect of the inventive concepts, the Si epitaxial layer 160 covers the top surface 150t and the inclined surface 150s of the SiGe epitaxial layer 150. Therefore, the metal layer 170 (i.e., the nickel layer) is spaced apart from the SiGe epitaxial layer 150 and the semiconductor substrate 10 as illustrated in FIG. 7. Accordingly, the nickel silicide layer 171 formed on the semiconductor substrate 10, as the end result of the thermal treatment process, does not encroach upon the semiconductor substrate 10. Also, because the metal layer 170 is prevented from reacting with the SiGe epitaxial layer 150 when the silicide layer 171 is formed, there is no increase in contact resistance in the source/drain region.

Finally, in the example in which the silicide layer 171 is a nickel silicide layer, the silicide layer 171 may be a layer of NiSi, NiSi$_2$, Ni$_3$Si$_2$, Ni$_2$Si or Ni$_{31}$Si$_{12}$. Also, the silicide layer 171 may have a composition of Ni$_x$Si$_{1-x}$ (0≤x≤1). An advantage of forming the silicide layer 171 of nickel silicide is that nickel silicide has a lower resistivity than cobalt silicide and titanium silicide and is formed by reacting nickel with silicon at a lower temperature than the temperature necessary to cause cobalt or titanium to react with silicon.

After the thermal treatment process, a wet etching process is performed to remove any un-silicided un-reacted metal. The wet etching process may use a solution of sulfuric acid (H$_2$SO$_4$) and hydrogen peroxide (H$_2$O$_2$) as an etchant.

Figure 9:
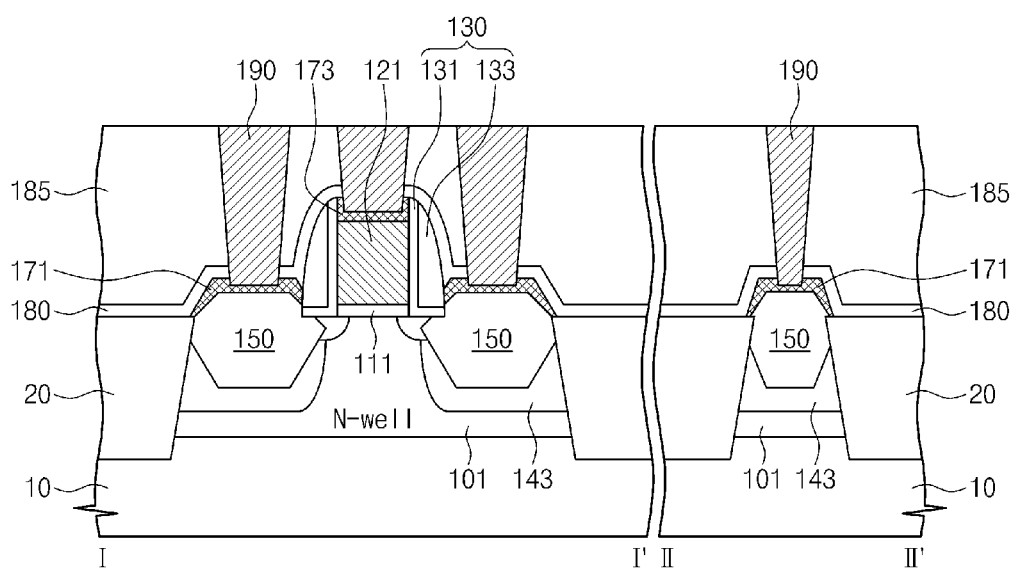
Figure 10:
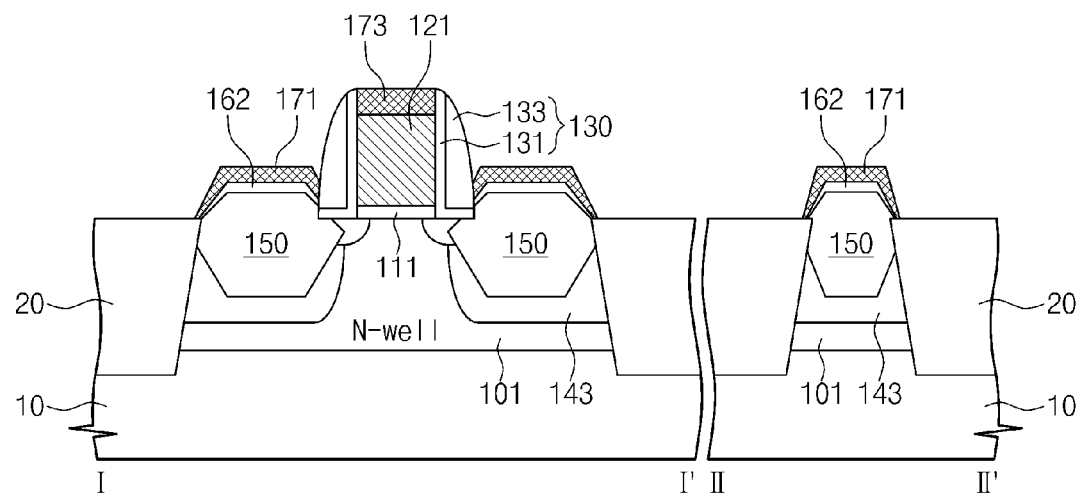

Referring to FIGS. 1, 2 and 9, a contact plug 190 connected to the silicide layer 171 is formed after the silicide layers 171 and 173 are formed.

More specifically, a conformal etch stop layer 180 may be formed on the semiconductor substrate 10. The etch stop layer 180 may comprise a silicon nitride layer or a silicon oxynitride layer. Next, an interlayer dielectric (ILD) 185 is formed on the semiconductor substrate 10. The interlayer dielectric 185 may be formed of O$_3$-TEOS (O$_3$-Tetra Ethyl OrthoSilicate), USG (Undoped Silicate Glass), PSG (PhosphoSilicate Glass), BSG (Borosilicate Glass), BPSG (BorophosphoSilicate Glass), FSG (Fluoride Silicate Glass), SOG (Spin On Glass), TOSZ (Tonen SilaZene), or a combination thereof. Also, the interlayer dielectric 185 may be formed by a CVD process or a spin coating process. The structure may be planarized after the interlayer dielectric 185 has been formed.

Contact holes exposing the silicide layer 171 are then formed in the interlayer dielectric 185. The contact holes can be formed by forming a mask on the interlayer dielectric 185, and anisotropically etching the interlayer dielectric 185 using the mask as an etch mask.

Subsequently, the contact holes are filled with a conductive material to form contact plugs 190. The contact plugs 190 are preferably formed of a low-resistivity metal material. For example, the contact plugs 190 may be formed of at least one metal layer (e.g., at least one of a cobalt layer, a titanium layer, a nickel layer, a tungsten layer and a molybdenum layer) and a conductive metal nitride layer (e.g., a titanium nitride layer, a tantalum nitride layer, a tungsten nitride layer or a titanium aluminum nitride layer). Furthermore, a metal barrier layer may be formed before the contact plugs 190 to prevent the diffusion of the metal material of the contact plugs 190. In this case, the metal barrier layer may comprise a conductive metal nitride layer such as a tungsten nitride (WN) layer, a tantalum nitride (TiN) layer or a titanium nitride (TaN) layer.

Note, although contact plugs 190 are shown as respectively connected to the gate silicide layer 173 and each silicide layer 171, a semiconductor device according to the inventive concepts may have various other arrangements of the contact plugs 190.

Figure 11:
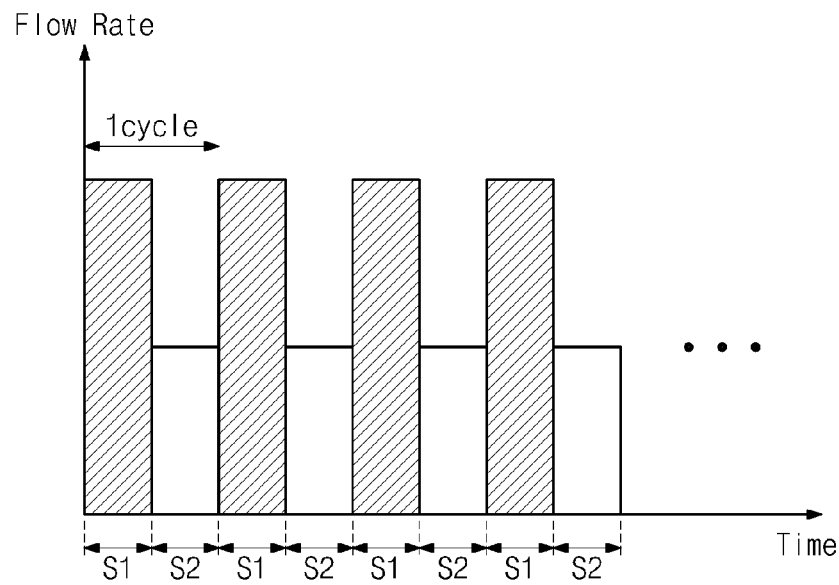
FIG. 11 is a graph illustrating a technique used to form a silicon epitaxial layer in a method of fabricating a semiconductor device according to the inventive concepts.

Referring to FIG. 11, the forming of the Si epitaxial layer 160 includes: alternately supplying silicon source gas (S1) and selective etch gas (S2) into a processing chamber, in which the semiconductor substrate 10 is disposed, as a cycle of operations; and then repeating the cycle at least once. The silicon source gas may comprise monochlorosilane ($SiH_3Cl$), dichlorosilane (DCS), trichlorosilane (TCS), hexachlorosilane (HCS), $SiH_4$, $Si_2H_6$, or a combination thereof. The selective etch gas may comprise HCl, $Cl_2$, or a combination thereof. Also, carrier gas may be supplied together with the silicon source gas so that the silicon source gas is uniformly dispersed over the semiconductor substrate 10. In this case, the carrier gas may comprise at least one of hydrogen, helium, nitrogen and argon. Also, the Si epitaxial layer 160 may be grown by conducting the process at a temperature of about 550° C. to about 700° C. under a pressure of several mTorr or less.

Figure 13A:
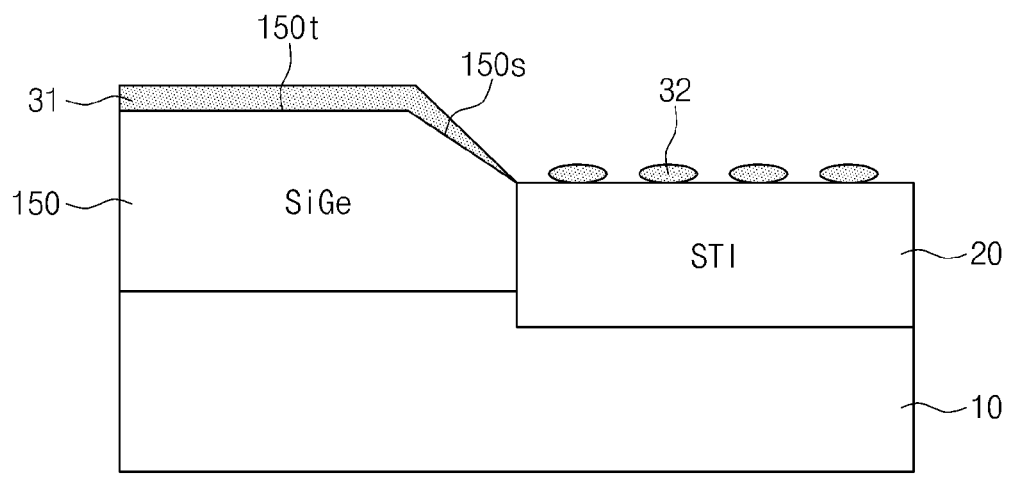
FIGS. 13A to 13D are sectional views illustrating a process of forming a silicon epitaxial layer according to the inventive concepts.

More specifically, and referring FIGS. 11 and 13A, the silicon source gas is supplied to the semiconductor substrate 10 on which the SiGe epitaxial layer 150 and the device isolation layer 20 have been formed (S1). In an example of this embodiment, a silane not including a chloride (e.g., $SiH_4$ and $Si_2H_6$) is used as the silicon source gas. The silane dissolves at about 650° C. into silicon atoms. At this time, the epitaxial layer is not etched because the dissolution of the silane does not produce any by-product corrosive to the epitaxial layer, such as a hydrogen chloride (HCl).

The silicon atoms generated by dissolving the silicon source gas bond with the surfaces of the device isolation layer 20 and the SiGe epitaxial layer 150. Accordingly, silicon layers 31 and 32 are formed on the surfaces of the device isolation layer 20 and the SiGe epitaxial layer 150. Here, the bonding force between an Si atom and the SiGe epitaxial layer 150 is stronger than the bonding force between a dielectric layer and an Si atom. Thus, the silicon layer 31 formed on the SiGe epitaxial layer 150 is thicker than the silicon layer 32 formed on the device isolation layer 20. Also, the silicon atoms may bond to only parts of the surface of the device isolation layer 20 as shown in the figure.

Meanwhile, as described above, because the growth rate of the Si epitaxial layer 160 depends on the crystal plane of the underlying lattice, the thickness of the silicon layer 31 growing on the top surface 150t of the SiGe epitaxial layer 150 becomes different from the thickness of the silicon layer 31 growing on an inclined surface 150s of the SiGe epitaxial layer 150. Specifically, the silicon layer 31 is thinner on the inclined surface 150s of the SiGe epitaxial layer 150 than on the top surface 150t of the SiGe epitaxial layer 150 parallel to the upper surface of the semiconductor substrate 10.

Figure 13B:
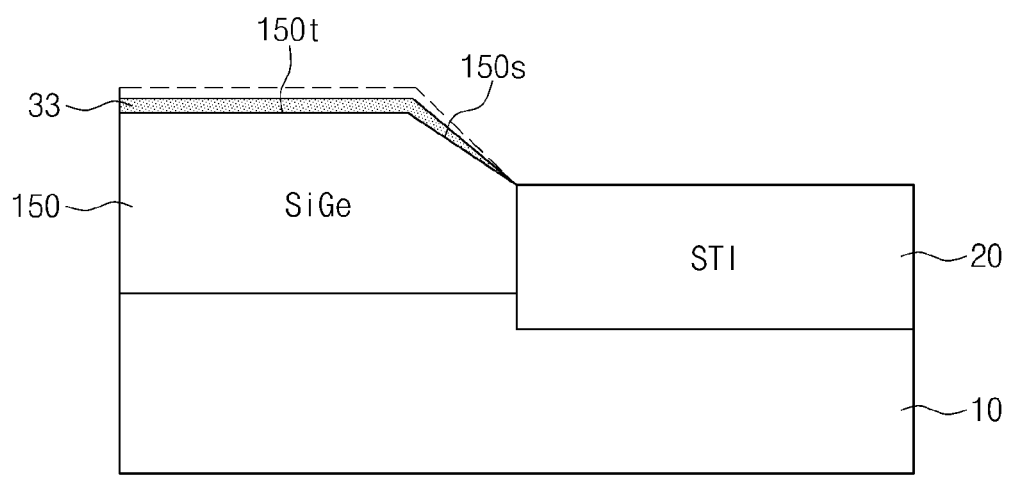
Figure 13C:
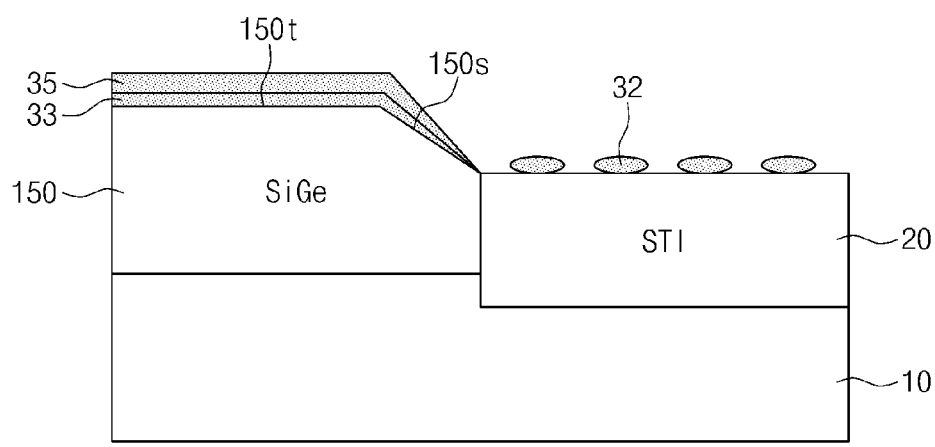
Figure 13D:
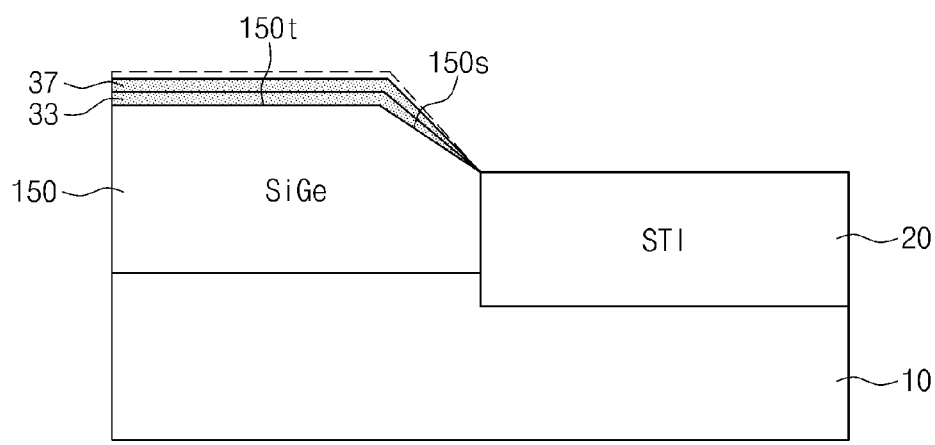

Referring to FIGS. 11 and 13B, next, the supplying of the silicon source gas is stopped, and the selective etch gas is supplied (S2). The selective etch gas comprises a halogen that will react with the silicon atoms. More specifically, when the selective etch gas is supplied to the semiconductor substrate 10, chlorine atoms of the selective etch gas bond with the Si to separate the silicon atoms from the SiGe epitaxial layer 150 and the device isolation layer 20. However, the Si on the device isolation layer 20 is removed by the etch gas more rapidly than the Si on the SiGe epitaxial layer 150 because the bonding force between the device isolation layer 20 and the silicon atoms is weak. Thus, the silicon layer 32 is removed from the device isolation layer 20, and the structure is left with a silicon epitaxial layer 33 on the SiGe epitaxial layer 150. Furthermore, the flow rate and/or the supply time of the selective etch gas is regulated to be lower than that of the silicon source gas to ensure that the silicon layer 31 is not completely removed from the SiGe epitaxial layer 150 during the cycle. Subsequently, as illustrated in FIGS. 11 and 13C, the silicon source gas is again supplied, and new silicon atoms bond to the surfaces of the device isolation layer 20 and the silicon epitaxial layer 33. Accordingly, the thickness of the silicon layer on the SiGe epitaxial layer 150 increases. Then, as illustrated in FIGS. 11 and 13D, the selective etch gas is supplied to remove all of the new silicon atoms from the device isolation layer 20, leaving another thickness 37 of the silicon epitaxial layer on the SiGe epitaxial layer 150.

The cycle may be repeated until a silicon layer of a predetermined thickness remains on the SiGe epitaxial layer 150.

Figure 12:
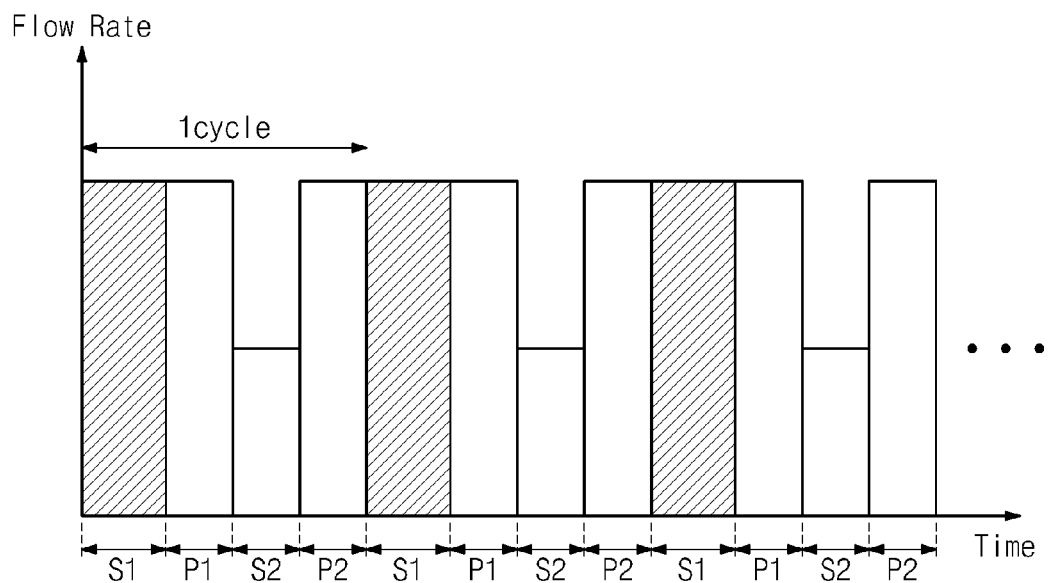
FIG. 12 is a graph illustrating another technique used to form a silicon epitaxial layer in a method of fabricating a semiconductor device according to the inventive concepts.

In another technique illustrated in FIG. 12, the forming of the Si epitaxial layer 160 includes: supplying the silicon source gas (S1), supplying purge gas in a first purge operation (P1), supplying the selective etch gas (S2), and supplying purge gas in a second purge operation (P2) in the foregoing sequence, into a process chamber in which the semiconductor substrate 10 is disposed, as a cycle of operations; and then repeating the cycle at least once.

According to this technique, the first purge operation P1 is performed to remove any silicon atoms that have not bonded to the surfaces of the device isolation layer 20 and the SiGe epitaxial layer 150 after the silicon source gas has been supplied. The purge gas may comprise hydrogen, helium, nitrogen or argon, and may be different from the carrier gas. On the other hand, the second purge operation P2 is performed to remove the by-products (e.g., $SiCl_4$ and $SiCl_3$) of the reaction between the silicon atoms and the chorine atoms of the selective etch gas. In this operation as well, the purge gas may comprise hydrogen, helium, nitrogen or argon, and may be different from the carrier gas.

These techniques may be carried out using batch-type high-vacuum CVD equipment. Thus, the selective Si epitaxial layer growth process may be performed on a plurality of semiconductor substrates 10 at a time.

Figure 14:
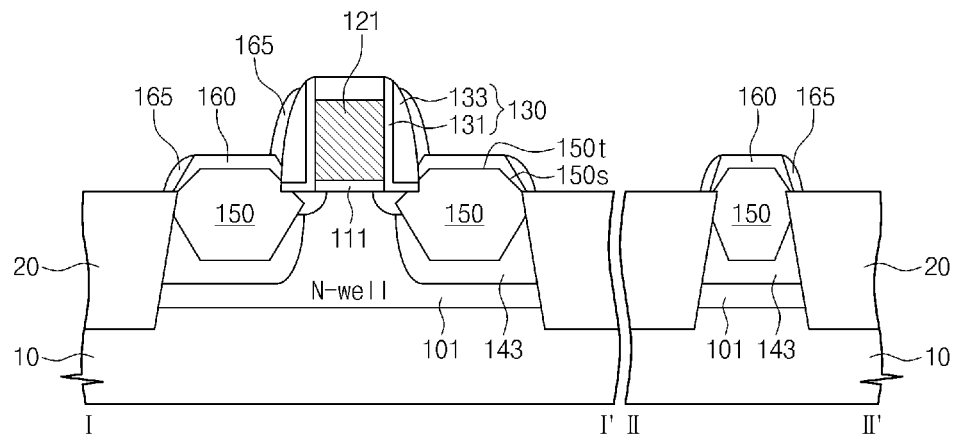
FIGS. 14 to 16 are each a pair of sectional views taken along lines I-I' and II-II' of FIG. 2, and illustrate processes in a second embodiment of a method of fabricating a semiconductor device according to the inventive concepts.
Figure 15:
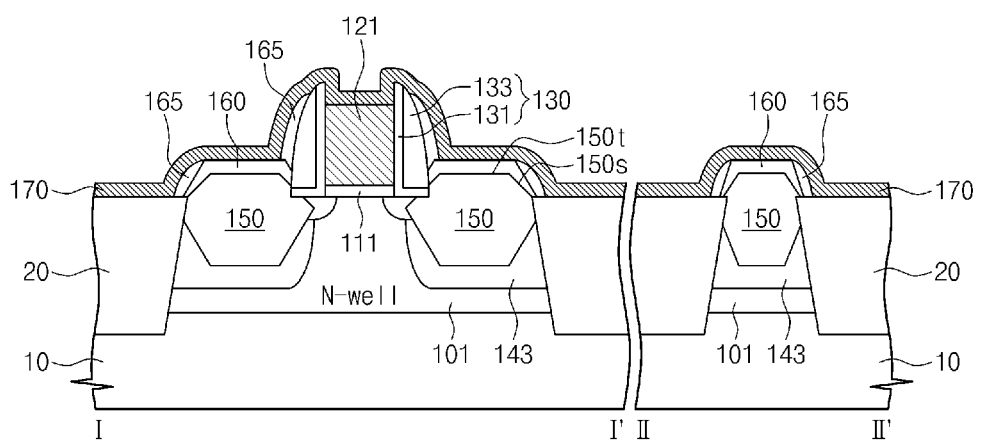
Figure 16:
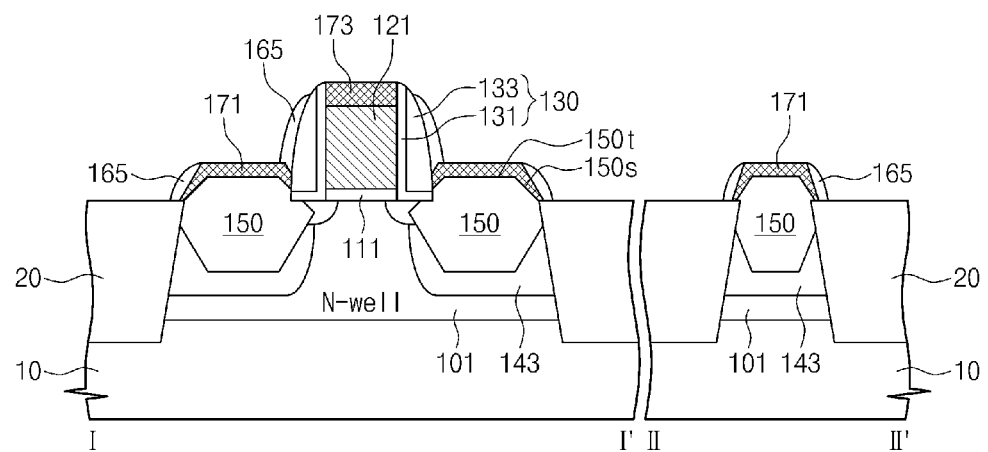

Processes in a second embodiment of a method of fabricating a semiconductor device according to the inventive concepts are illustrated in FIGS. 14 to 16. Aspects of this embodiment, other than those described below, are similar to those of the first embodiment and hence, will not be described in detail for the sake of brevity. Mainly, though, this embodiment differs from the first embodiment in that a dielectric spacer 165 is formed on the device isolation layer 20 to cover one side of the Si epitaxial layer 160 before a silicide process is performed.

Specifically, as illustrated in FIG. 14, after the Si epitaxial layer 160 is formed, a dielectric layer is conformally formed on the semiconductor substrate 10. The dielectric layer may comprise a silicon oxide layer, a silicon nitride layer, a silicon oxynitride layer, or a combination thereof.

Subsequently, a blanket anisotropic etching process (e.g., an etch-back process) is performed to etch the dielectric layer until the Si epitaxial layer 160 is exposed. Because the SiGe epitaxial layer 150 is elevated above the upper surface of the active region of the semiconductor substrate 10, a dielectric spacer 165 is formed over the inclined surface 150s of the SiGe epitaxial layer 150 at one side of the Si epitaxial layer 160. Similarly, the dielectric spacer 165 is also formed on one side of the gate spacer 130.

Referring to FIG. 15, a metal layer 170 is conformally formed on the semiconductor substrate 10. Thus, the metal layer 170 covers the device isolation layer 20, the dielectric spacer 165, the Si epitaxial layer 160, and the gate electrode 121. Also, only the top surface of the Si epitaxial layer 160 parallel to the upper surface of the semiconductor substrate 10 contacts the metal layer 170 because the side of the Si epitaxial layer 160 is covered by the dielectric spacer 165.

Subsequently, a thermal treatment process is performed to cause the metal layer 170 to react with the Si epitaxial layer 160 as described with reference to FIG. 7, thereby forming a silicide layer 171 on the SiGe epitaxial layer 150 as illustrated in FIG. 16. In this case, the metal material of layer 170 is prevented from reacting with the semiconductor substrate 10 and the SiGe epitaxial layer 150 because the Si epitaxial layer 160 and the dielectric spacer 165 are disposed between the metal layer 170 and the inclined surface 150s of the SiGe epitaxial layer 150. That is, it is possible to prevent an encroachment of the nickel silicide layer 171 upon the semiconductor substrate 10.

Furthermore, in this embodiment, the Si epitaxial layer 160 remains on the inclined surfaces 150s of the SiGe epitaxial layer 150, i.e., does not react there with the metal layer 170 during the siliciding process, because the metal layer 170 locally contacts only the top surface 160t of the Si epitaxial layer 160. That is, the silicide layer 171 may be locally formed on the top surface 150t of the SiGe epitaxial layer 150.

A third embodiment of a method of fabricating a semiconductor device according to the inventive concepts will now be described with reference to FIGS. 17 to 20. Aspects of this embodiment, other than those described below, are similar to those of the first embodiment and hence, will not be described in detail for the sake of brevity.

Figure 17:
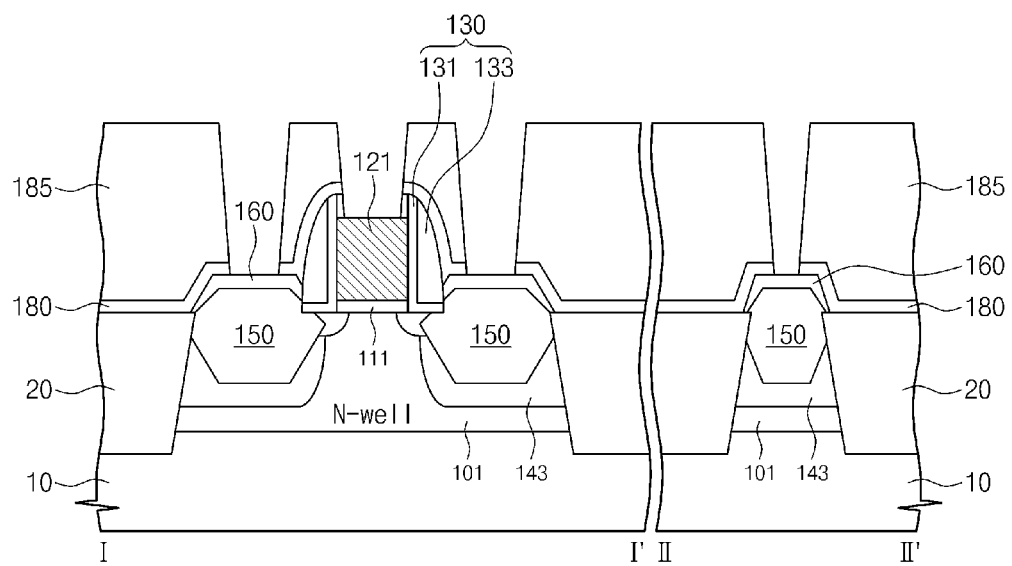
FIGS. 17 to 20 are each a pair of sectional views taken along lines I-I' and II-II' of FIG. 2, and illustrate processes in a third embodiment of a method of fabricating a semiconductor device according to the inventive concepts.

Referring first to FIG. 17, an etch stop layer 180 and an interlayer dielectric 185 are sequentially formed on the semiconductor substrate 10 after the Si epitaxial layer 160 has been formed. As was described with reference to FIG. 9, the etch stop layer 180 is conformally formed on the semiconductor substrate 10. Also, the interlayer dielectric 185 is formed of dielectric material having good step coverage. Then, the interlayer dielectric 185 is patterned to form contact holes exposing the Si epitaxial layer 160. At this time, a contact hole may also be formed to expose the gate electrode 121.

Figure 18:
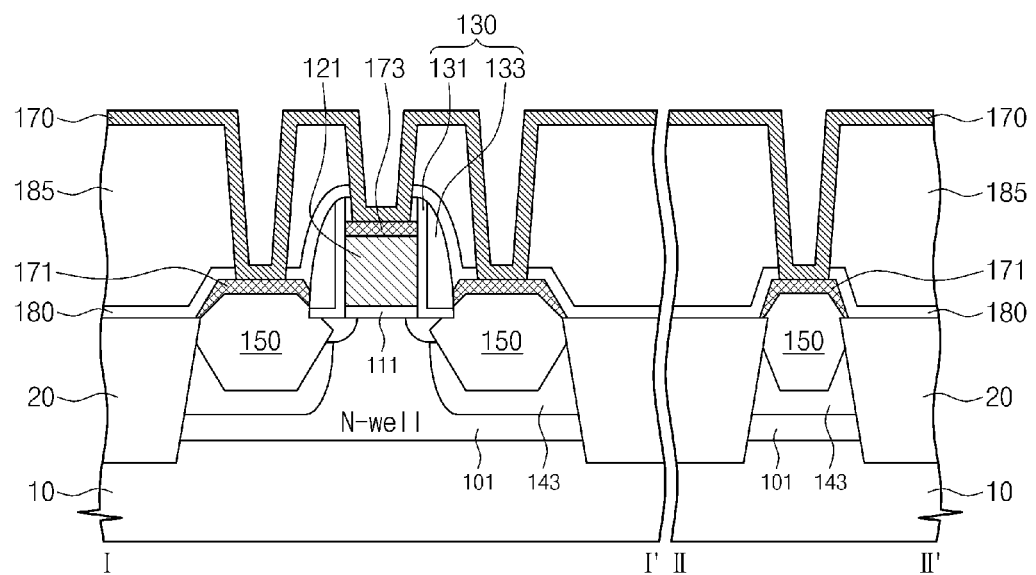

Referring to FIG. 18, a metal layer 170 is conformally formed on the interlayer dielectric 185 through which the contact holes have been formed, and a thermal treatment process is performed to form silicide layers 171 and 173.

In this embodiment, only that portion of the Si epitaxial layer 160 exposed by a contact hole reacts with the metal layer 170 to form the silicide layer 171. That is, the silicide layer 171 is locally formed on the top surface 150t of the SiGe epitaxial layer 150, and an Si epitaxial layer 160 remains on the inclined surfaces 150s of the SiGe epitaxial layer 150.

Figure 19:
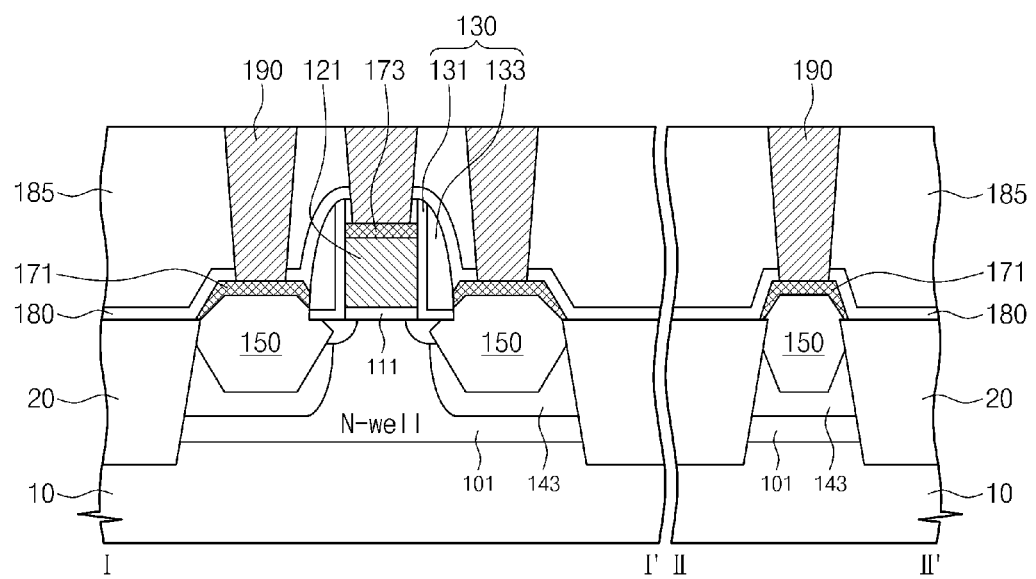

Next, the metal layer 170 not reacting with the Si epitaxial layer 160 on the interlayer dielectric 185 is removed, and the contact holes are filled with a conductive material to form contact plugs 190 contacting the silicide layer as illustrated in FIG. 19.

Figure 20:
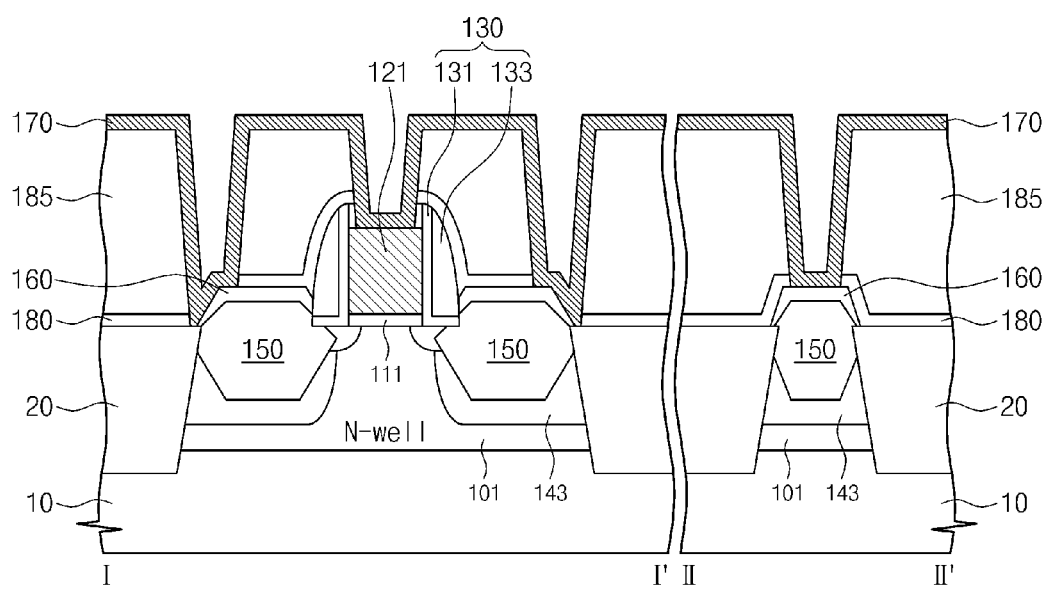

Meanwhile, as illustrated in FIG. 20, due to an alignment error in the process of forming the contact holes, the contact holes may expose the inclined surfaces 150s of the SiGe epitaxial layer 150. If the Si epitaxial layer were selectively formed on the top surface 150t of the SiGe epitaxial layer 150 (refer to an illustration of this case depicted by layer 160' in FIG. 6), the inclined surface 150s of the SiGe epitaxial layer 150 would be exposed by the contact hole. In this case, in the silicide process, the metal layer 170 would directly contact the SiGe epitaxial layer 150, the metal layer 170 would infiltrate between the SiGe epitaxial layer 150 and the device isolation layer 20, and hence the metal layer would react with the semiconductor substrate 10 during the siliciding process.

However, in this embodiment, as illustrated in FIG. 20, even in the case of an alignment error in which the contact holes are aligned with the inclined surface 150s of the SiGe epitaxial layer 150, the metal layer 170 is prevented from reacting with the SiGe epitaxial layer 150 or the semiconductor substrate 10 because the inclined surface 150s of the SiGe epitaxial layer 150 is covered by the Si epitaxial layer 160.

A fourth embodiment of a method of fabricating a semiconductor device according to the inventive concepts will now be described with reference to FIG. 21 and FIGS. 22 to 27.

In this embodiment, a CMOS device constituted by NMOS and PMOS transistors is formed. As was described above, the operating characteristics of a PMOS transistor can be improved by improving the mobility of holes in the channel region. Also, as was described above, the operating characteristics of an NMOS transistor may be improved by improving the mobility of electrons in the channel region. When the channel region of the NMOS transistor is formed lengthwise in any of the <110> directions, tensile stress applied to the channel region of the NMOS transistor improves the mobility of electrons through the channel.

Figure 21:
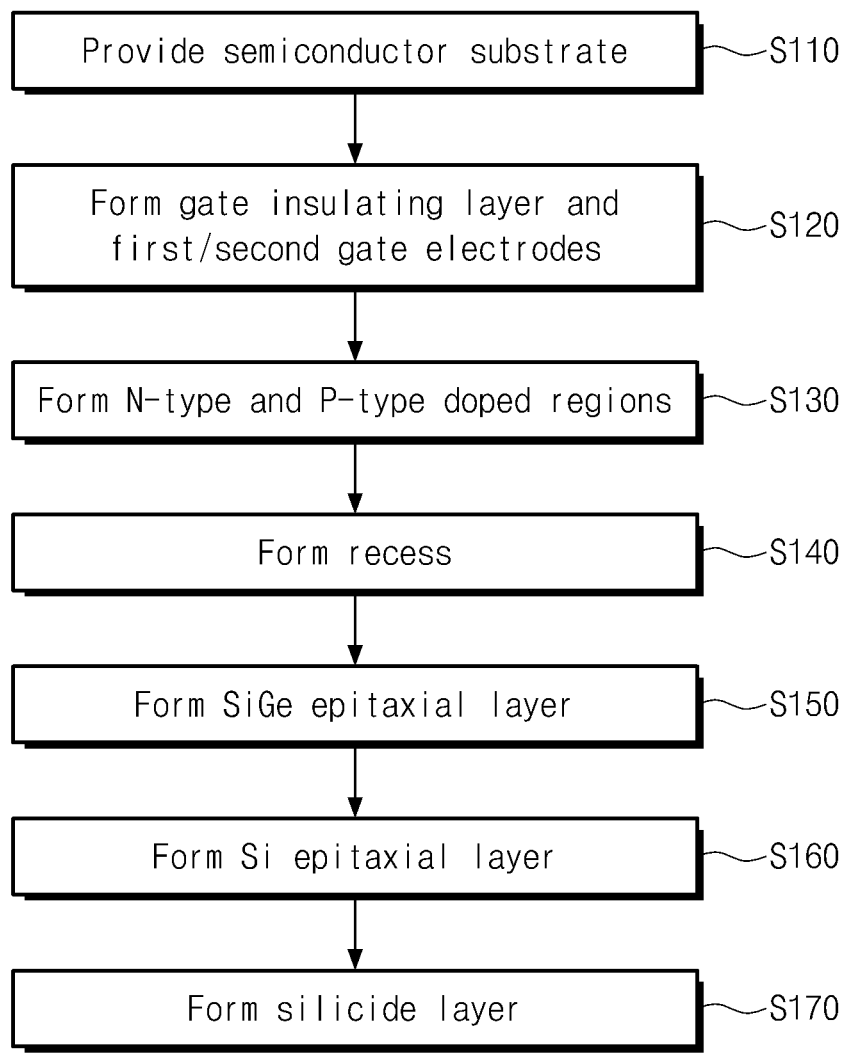
FIG. 21 is a flow chart of a fourth embodiment of method of fabricating a semiconductor device according to the inventive concepts.
Figure 22:
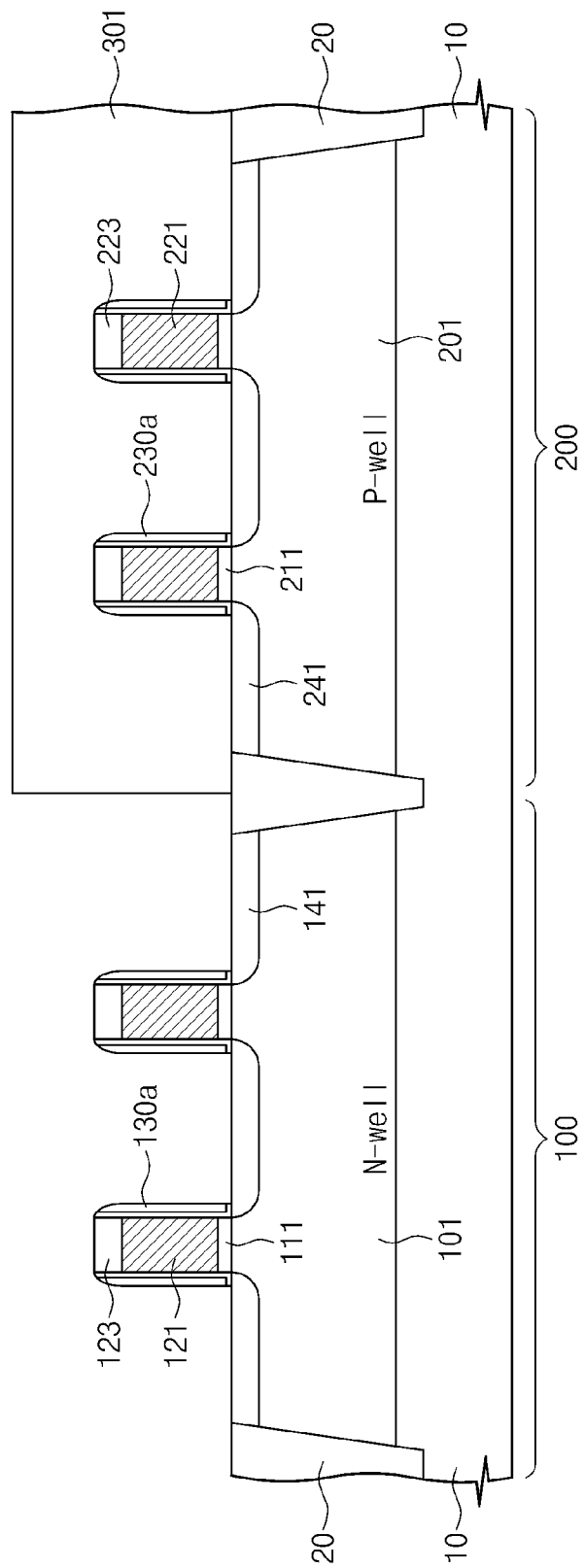
FIGS. 22 to 27 are each a pair of sectional views taken along lines I-I' and II-II' of FIG. 2, and illustrate processes in the fourth embodiment of a method of fabricating a semiconductor device according to the inventive concepts.

Referring now to FIGS. 21 and 22, a semiconductor substrate 10 including a first region 100 for accommodating PMOS transistors and a second region 200 for accommodating NMOS transistors is provided (S110).

As described with respect to Embodiment 1, the semiconductor substrate 10 may be a silicon substrate with a (100) plane. Furthermore, first and second active regions are respectively defined in the first and second regions 100 and 200 by the device isolation layer 20. The semiconductor substrate 10 also includes n-type and p-type doped wells 101 and 201. For example, the first active region includes an n-type well 101 for PMOS transistors, and the second active region includes a p-type well 201 for NMOS transistors.

Next, first gate electrodes 121 and second gate electrodes 221 are formed respectively on the first and second regions 100 and 200 (S120). For simplicity, reference may be made at times to only one of the first gate electrodes and only one of the second gate electrodes hereafter.

The first and second gate electrodes are formed by sequentially forming a gate insulating layer, a gate conductive layer and a capping layer on the first and second regions 100 and 200 and patterning the resulting stack of layers. Herein, the first and second gate insulating layers 111 and 211 may comprise a silicon oxide layer, a silicon nitride layer, a silicon oxynitride layer, a high-k dielectric layer, or a combination thereof. Thus, a first gate structure having a first gate insulating layer 111, the first gate electrode 121 and a first capping layer 123 is formed on the first region 100, and a second gate structure having a second gate insulating layer 211, the second gate electrode 221 and a second capping layer 223 is formed on the second region 200. The first and second gate electrodes 121 and 221 may each be of n-type or p-type doped polysilicon (poly-Si). Alternatively, the first and second gate electrodes 121 and 221 may each be of a metal material.

Subsequently, a first spacer 130a is formed on opposite sidewalls of the first gate electrode 121, and a first spacer 230a is formed on opposite sidewalls of the second gate electrode 221. Specifically, a dielectric layer is formed on the semiconductor substrate 10, and then a blanket anisotropic etching process (e.g., an etch-back process) is performed to form the first spacers 130a and 230a. The first spacers 130a and 230a may be formed by sequentially forming an oxide layer and a nitride layer and etching back the oxide layer and the nitride layer. In this case, each of the first spacers 130a and 230a includes L-shaped lower spacer elements and upper spacer elements. The oxide layer cures the sidewalls of the first and second gate electrodes 121 and 221 of any damage which may have occurred when the layers were patterned to form the first and second gate electrodes 121 and 221. In addition, the oxide layer can serve as a buffer between the nitride layer and the first and second gate electrodes 121 and 221.

Next, p-type doped regions are formed at both sides of the first gate electrode 121, and n-type doped regions are formed at both sides of the second gate electrode 221. In an example of this embodiment, the n-type and p-type doped regions each include lightly-doped and heavily-doped regions.

Specifically, the first region 100 is covered by a mask and an n-type dopant (e.g., As) is ion-implanted into the semiconductor substrate 10 at both sides of the second gate electrode 221 to form an n-type lightly-doped region 241. Subsequently, a p-type channel doped region may be formed under the second gate electrode 221 to prevent a punch-through phenomenon.

Then, the second region 200 is covered by a mask and a p-type dopant (e.g., B) is ion-implanted into the semiconductor substrate 10 at both sides of the first gate electrode 121 to form a p-type lightly-doped region 141. Thereafter, an n-type channel doped region may be formed under the first gate electrode 121 to prevent a punch-through phenomenon.

Figure 23:
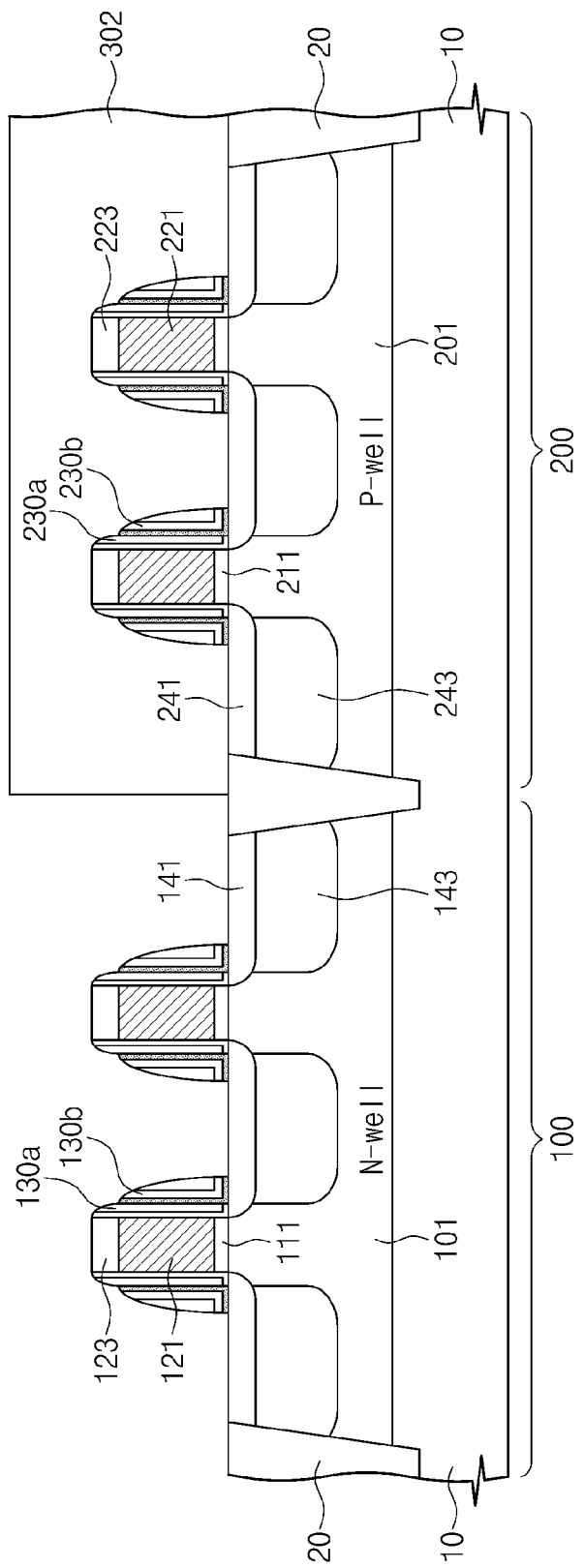

Referring to FIG. 23, a second spacer 130b is formed on both sides of the first gate electrode 121, and a second spacer 230b is formed on both sides of the second gate electrode 221. Specifically, a dielectric layer is deposited on the semiconductor substrate 10, and then a blanket anisotropic etching process (e.g., an etch-back process) is performed to form the second spacers 130b and 230b. Similar to the process of forming the first spacers 130a and 230a, the second spacers 130b and 230b may be formed by sequentially forming an oxide layer and a nitride layer and etching back the oxide layer and the nitride layer. Accordingly, the second spacers 130b and 230b may each include L-shaped lower spacer elements and upper spacer elements.

Next, n-type and p-type heavily-doped regions 143 and 243 are formed. The second spacers 130b and 230b serve to increase the distance between adjacent ones of the heavily-doped regions 143 and adjacent ones of the heavily-doped regions 243. Thus, the second spacers 130b and 230b act as a means to ensure that the resulting transistors are not prone to experiencing a short channel effect.

Similar to the processes of forming the lightly-doped regions 141 and 241, the respective processes of forming the heavily-doped regions 143 and 243 may be performed sequentially on the first and second regions 200. That is, the first region 100 is covered by a mask and an n-type dopant (e.g., As) is ion-implanted into the semiconductor substrate 10 at both sides of the second gate electrode 221 to form n-type heavily-doped regions 243. Then, the second region 200 is covered by a mask and a p-type dopant (e.g., B) is ion-implanted into the semiconductor substrate 10 at both sides of the first gate electrode 121 to form p-type heavily-doped regions 143.

Figure 24:
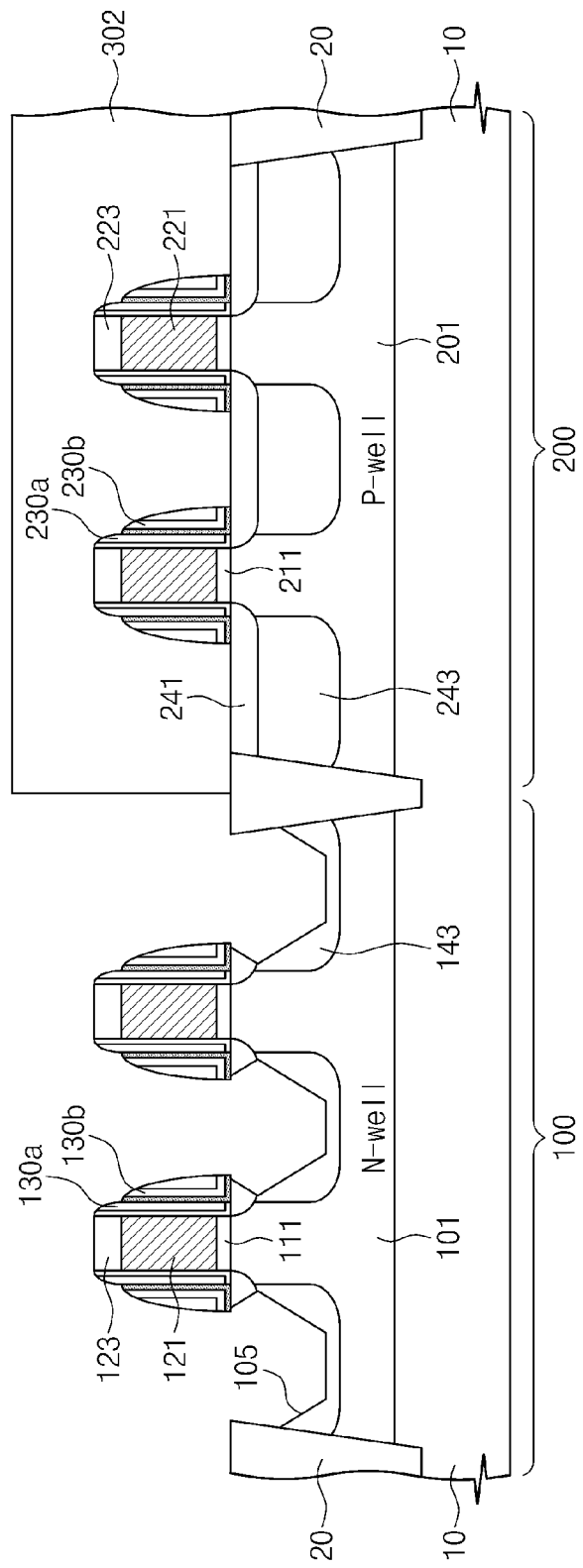

Referring to FIGS. 21 and 24, a recess 105 is formed to a predetermined depth in the semiconductor substrate 10 at both sides of the gate electrode 121 (S140). Note, the depth to which the dopant is implanted in the forming of the p-type heavily-doped regions 143 is predetermined to be greater than the depth of the recess 105. Thus, as was described above, the p-type heavily-doped regions 143 prevent the recess 105 from exposing the N-well 101 and therefore serve to prevent leakage current through defects formed on the surfaces delimiting the recess 105.

The recess 105 is formed by covering the second region 200 with a mask 302 and then, as was described with reference to FIG. 5, the substrate 10 is etched using the first gate electrode 121, the first and second spacers 130b and 230b and the device isolation layer 20 as an etch mask.

In this embodiment, the recess 105 is formed between the device isolation layer 20 and an adjacent first gate electrode 121 and between adjacent ones of the first gate electrodes 121. Also, as is clear from the description of FIG. 5, the recess 105 may be defined by a bottom surface parallel to the upper surface of the active region of the substrate 10, and first and second side surfaces adjacent to a first gate electrode 121 and inclined (at an obtuse angle) relative to the bottom surface. Again reference may be made to the description of FIG. 5 for other aspects and features of the recess.

Figure 25:
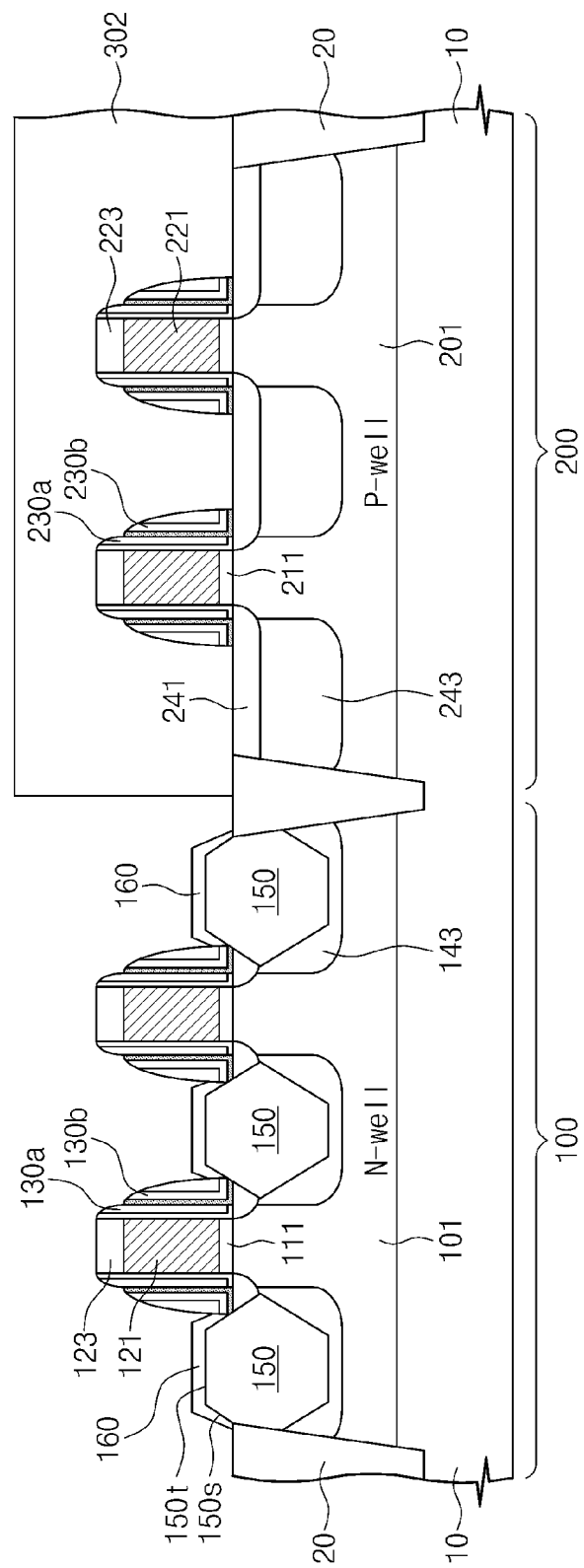

Referring to FIGS. 21 and 25, an SiGe epitaxial layer 150 is grown in the recess 105 (S150).

The SiGe epitaxial layer 150 is formed by a selective epitaxial growth process. For all aspects of this process and characteristics of the resulting SiGe epitaxial layer 150, reference may be had to the description of FIG. 6.

In this embodiment, the segment of the SiGe epitaxial layer 150 grown between adjacent ones of the first gate electrodes 121 is confined between the second spacers 130b on the confronting sidewalls of the adjacent ones of the first gate electrodes 121. Thus, the segment of the SiGe epitaxial layer 150 grown between the adjacent first gate electrodes 121 contacts the second spacers 130b. More specifically, inclined surfaces 150s of the upper portion of the SiGe epitaxial layer 150, which projects above the level of the upper surface of the active region of the semiconductor substrate 10, contact the second spacers 130b.

Subsequently, a selective epitaxial growth process is performed to form an Si epitaxial layer 160 on the SiGe epitaxial layer 150 (S160). This process is performed in any of the manners described above with reference to FIGS. 12 to 17.

Figure 26:
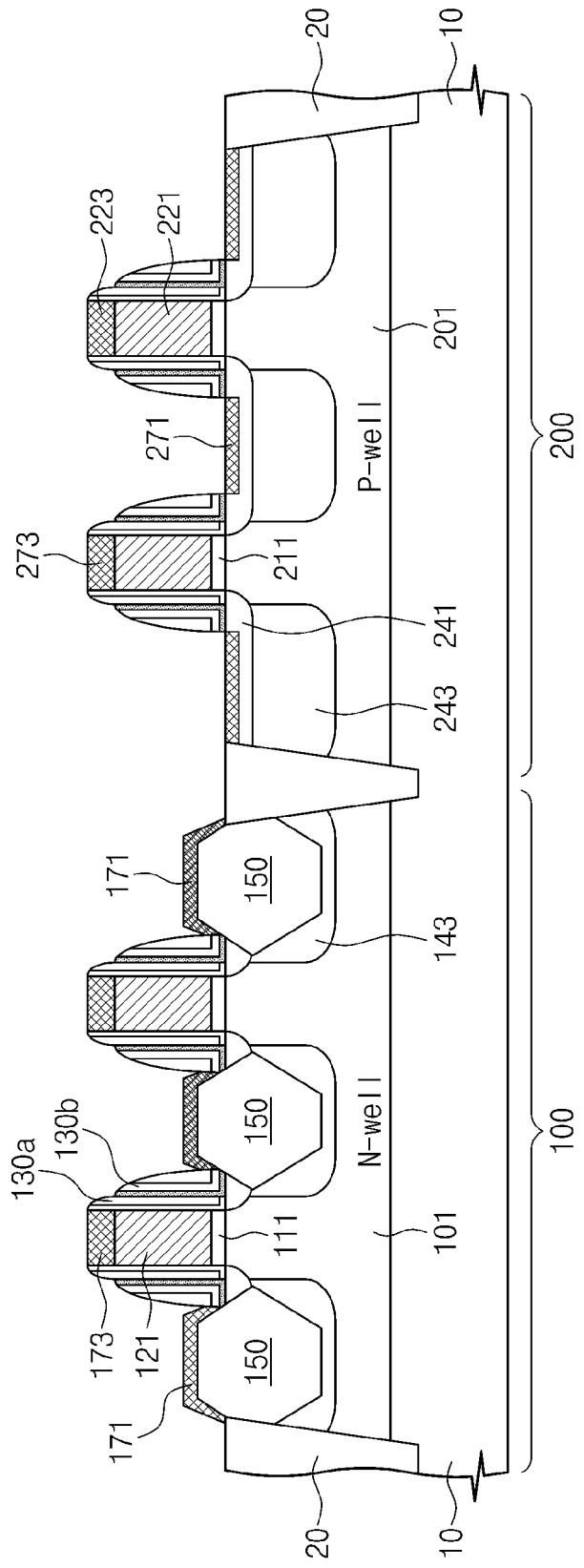

Referring to FIGS. 21 and 26, silicide layers 171, 173, 271 and 273 are formed in the first and second regions 100 and 200 (S170).

Specifically, the mask 302 covering the second region 200 is removed. Also, in the case in which the first and second gate electrodes 121 and 221 are formed of doped polysilicon, the capping patterns 123 and 121 are removed. Subsequently, a metal layer is conformally formed over the entirety of the first and second regions 100 and 200, and a thermal treatment process is performed on the resulting structure. As was described above, the metal layer is preferably a nickel layer. As a result of the thermal treatment process, the metal layer reacts with the Si epitaxial layers 160 on the first region 100, the first and second gate electrodes 121 and 221, and the doped regions 243 of the second region 200. Accordingly, the silicide layers 171 and 271 are formed on the SiGe epitaxial layer 150 on the first region 100 and the doped regions 243 of the second region 200, and the gate silicide layers 173 and 273 are formed on the first and second gate electrodes 121 and 221. Also, any part of the metal layer which has not reacted with the silicon may be removed after the thermal treatment process.

Figure 27:
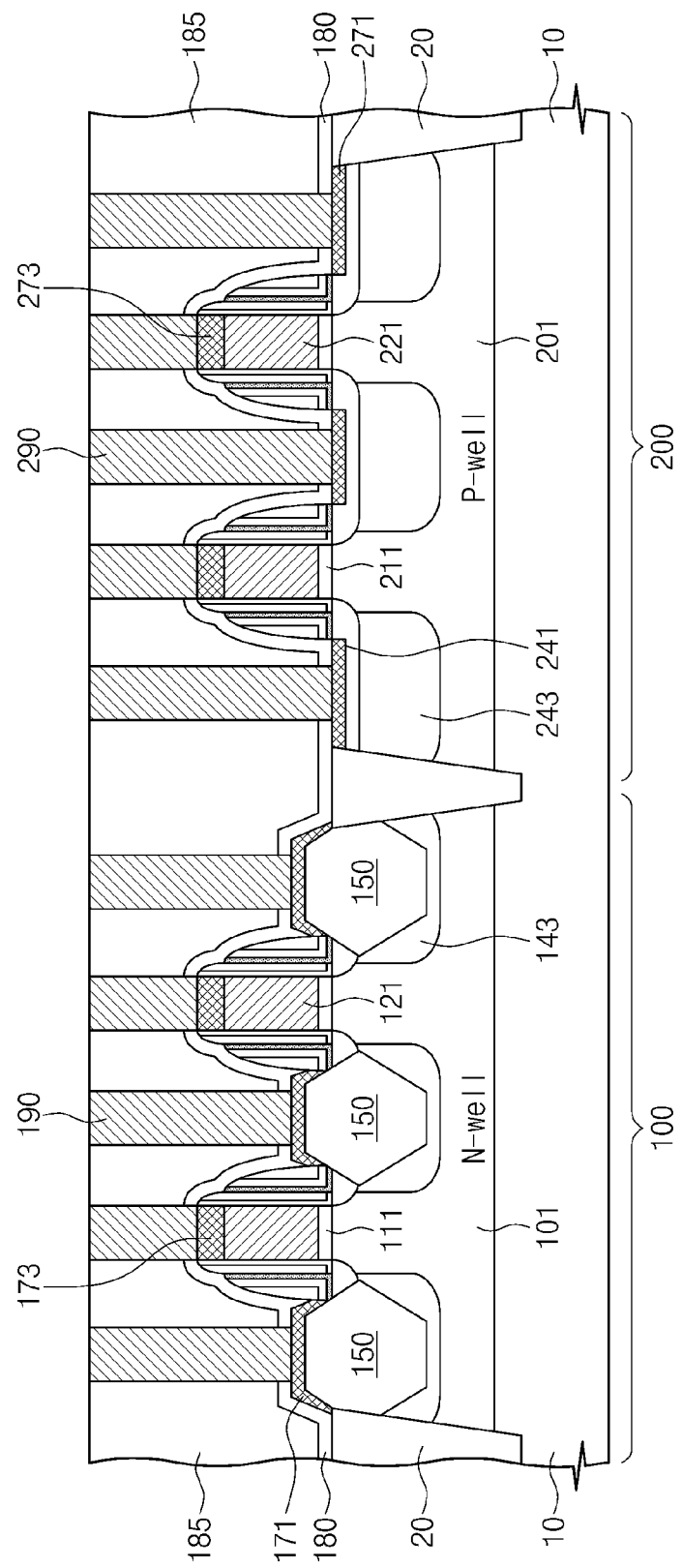

Referring to FIGS. 21 and 27, contact plugs 190 and 290 connected to the silicide layers 171, 173, 271 and 273 are then formed.

Specifically, an etch stop layer 180 and an interlayer dielectric 185 are sequentially formed on the semiconductor substrate 10 as described with reference to FIG. 9. Furthermore, a stress-inducing layer, including internal stress, may be formed on the second region 200 of the semiconductor substrate 10 before the interlayer dielectric 185 is formed. The stress in the layer is "memorized" as compressive stress by the source and drain regions at opposite sides of the gate electrode 121 such that tensile stress is imparted to the channel region of the NMOS transistor.

In any case, the etch stop layer 180 and the interlayer dielectric 185 are patterned to form contact holes that expose the silicide layers 171, 173, 271 and 273. Ideally, respective ones of the contact holes expose those portions of the silicide layer 171 situated only on the top surface 150t of the SiGe epitaxial layer 150. Next, the contact holes are filled with conductive material to form contact plugs 190 and 290. FIG. 27 illustrates an example in which a respective contact plug is connected to each silicide layer. However, other arrangements of the contact plugs are possible within the scope of the inventive concepts.

However, the contact holes formed to expose the silicide layer 171 may instead be aligned with inclined surfaces 150s of the SiGe epitaxial layer 150. Nonetheless, the contact plugs that fill these contact holes do not contact the SiGe epitaxial layer 150 because even the inclined surfaces 150s of the SiGe epitaxial layer 150 are covered by the silicide layer 171. Therefore, an increase in contact resistance is prevented.

In another example of this embodiment, the silicide process may be performed after the interlayer dielectric 185 and contact holes have been formed, as described with reference to FIGS. 17 to 19. That is, in this example, contact holes are formed in the interlayer dielectric 185, and the metal layer 170 is conformally formed on the interlayer dielectric 185. Then, the silicide layers 171, 173, 271 and 273 are formed by thermally treating the structure. In this case, only those portions of the Si epitaxial layer 160 on the first region 100 and doped regions of the second region which were exposed by the contact holes react with the metal layer to form a silicide. That is, the silicide layers 171 and 271 are locally formed on the top surface 150t of the SiGe epitaxial layer 150 and on the n-type heavily-doped region 243, and the Si epitaxial layer may remain on the inclined surfaces 150s of the SiGe epitaxial layer 150.

Figure 28:
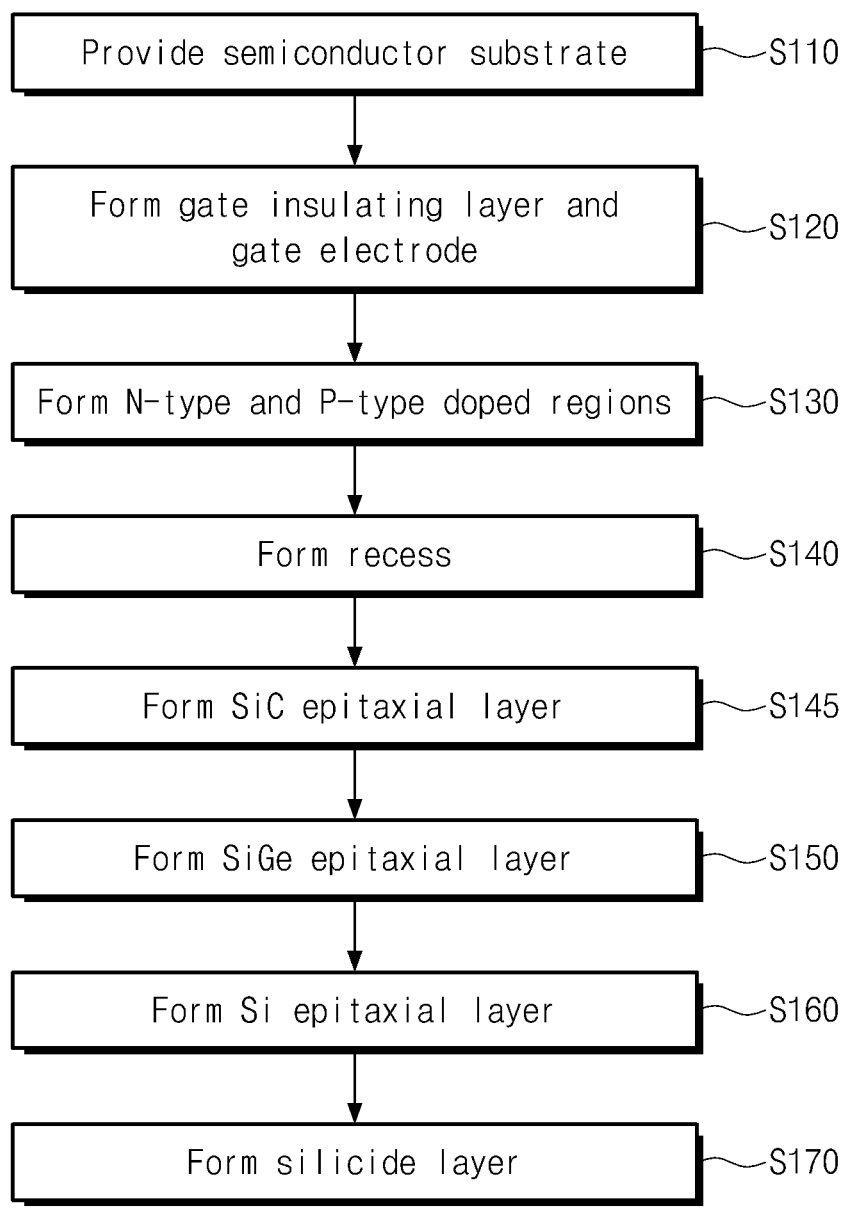
FIG. 28 is a flow chart of a fifth embodiment of a method of fabricating a semiconductor device according to the inventive concepts.
Figure 29:
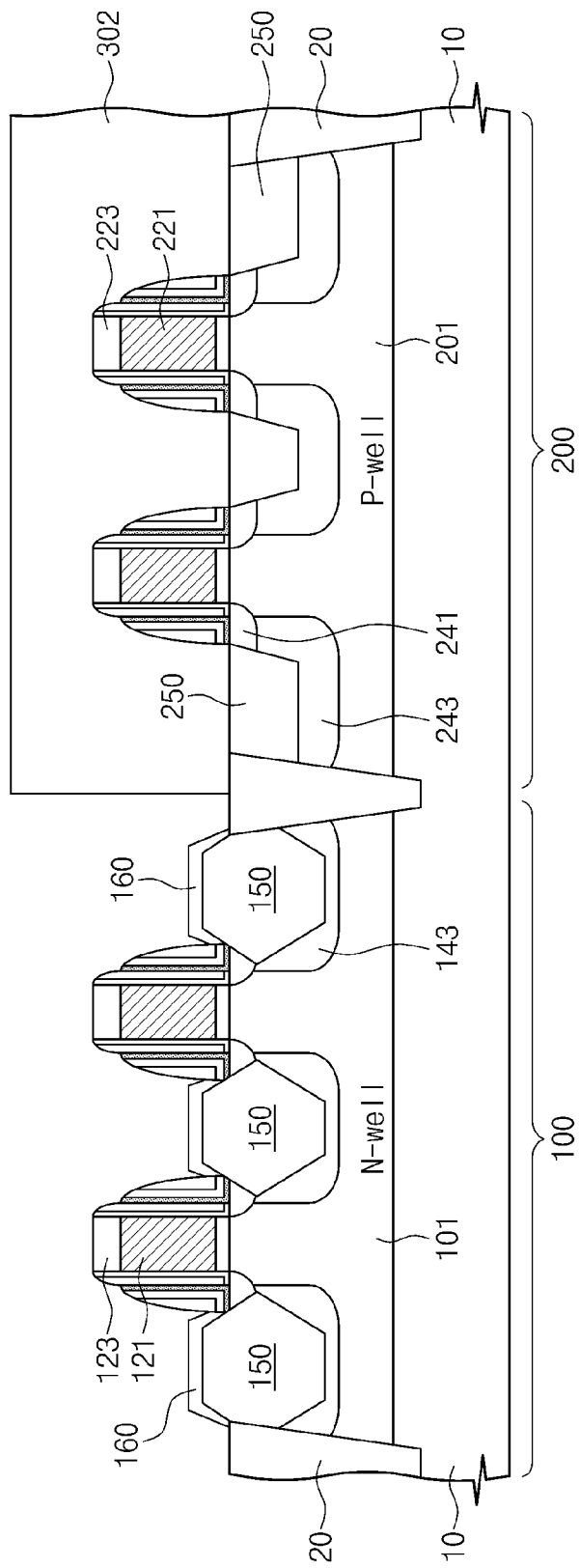
FIG. 29 is a sectional view of a semiconductor device fabricated by the method illustrated in FIG. 28.

A fifth embodiment of a method of fabricating a semiconductor device will now be described with reference to FIGS. 28 and 29. Aspects of this embodiment, other than those described below, are similar to those of the first and fourth embodiments and hence, will not be described in detail for the sake of brevity.

Basically, this method of fabricating a semiconductor device according to the inventive concepts is the same as that of fourth embodiment with the exception of forming an SiC epitaxial layer 250 in the n-type source/drain region of the NMOS transistor.

Specifically, the forming of the SiC epitaxial layer 250 at both sides of the second gate electrode 221 includes: forming a trench in the semiconductor substrate 10 at both sides of the second gate electrode 221; and performing a selective epitaxial growth process to grow an SiC layer in the trench.

The trench may be formed by anisotropically etching the substrate 10 using the second gate electrode 221 and the spacers as an etch mask. At this time, the first region 100 is covered with a mask.

The selective epitaxial growth process for forming the SiC epitaxial layer 250 may be performed by simultaneously supplying silicon source gas, carbon source gas and selective etch gas to the substrate 10. The silicon source gas may comprise dichlorosilane (DCS), trichlorosilane (TCS), hexachlorosilane (HCS), $SiH_4$, $Si_2H_6$, or a combination thereof. The carbon source gas may comprise $SiH_3CH_3$, $CH_4$, $C_2H_4$, or a combination thereof. The selective etch gas may comprise HCl, $Cl_2$, or a combination thereof.

The lattice constant of carbon is smaller than the lattice constant of silicon. Therefore, the lattice of the substrate 10 at both sides of the second gate electrode 221 contracts when the SiC epitaxial layer 250 is formed. As a result of the contraction of the lattice, tensile stress is induced in the channel region under the second gate electrode 221. Accordingly, the mobility of electrons in the channel under the second gate electrode 221 is improved.

Also, in an example of this embodiment, the mask 302 may be removed after the SiGe and SiC epitaxial layers 150 and 250 have been formed. The Si epitaxial layer 160 is then grown on not only the exposed of the SiGe epitaxial layer 150 but also on the exposed surface of the SiC epitaxial layer 250. Then, the siliciding process is performed so that the SiC epitaxial layer 250 is silicided as well. Thus, a semiconductor device according to the inventive concepts may have first and second epitaxial regions comprising carbon located on respective opposite sides of a gate electrode structure (comprising gate electrode 221) in the active region in region 200 of the substrate 10, and first and second silicide layers located on the first and second epitaxial regions, respectively, wherein at least a portion of each of the first and second silicide layers is devoid of carbon and comprises silicon and either a metal or metal alloy.

A sixth embodiment of a method of fabricating a semiconductor device according to the inventive concepts will now be described with reference to FIG. 30 and FIGS. 31 to 34. Aspects of this embodiment, other than those described below, are similar to those of the previous embodiments and hence, will not be described in detail for the sake of brevity. In particular, the sixth embodiment of the method of fabricating a semiconductor device is essentially the same as that of the first and fourth embodiments with the exception of the forming of the end gate electrodes. In this embodiment, metal gate electrodes are formed after the silicide layers 171 and 271 have been formed in source/drain regions.

Figure 30:
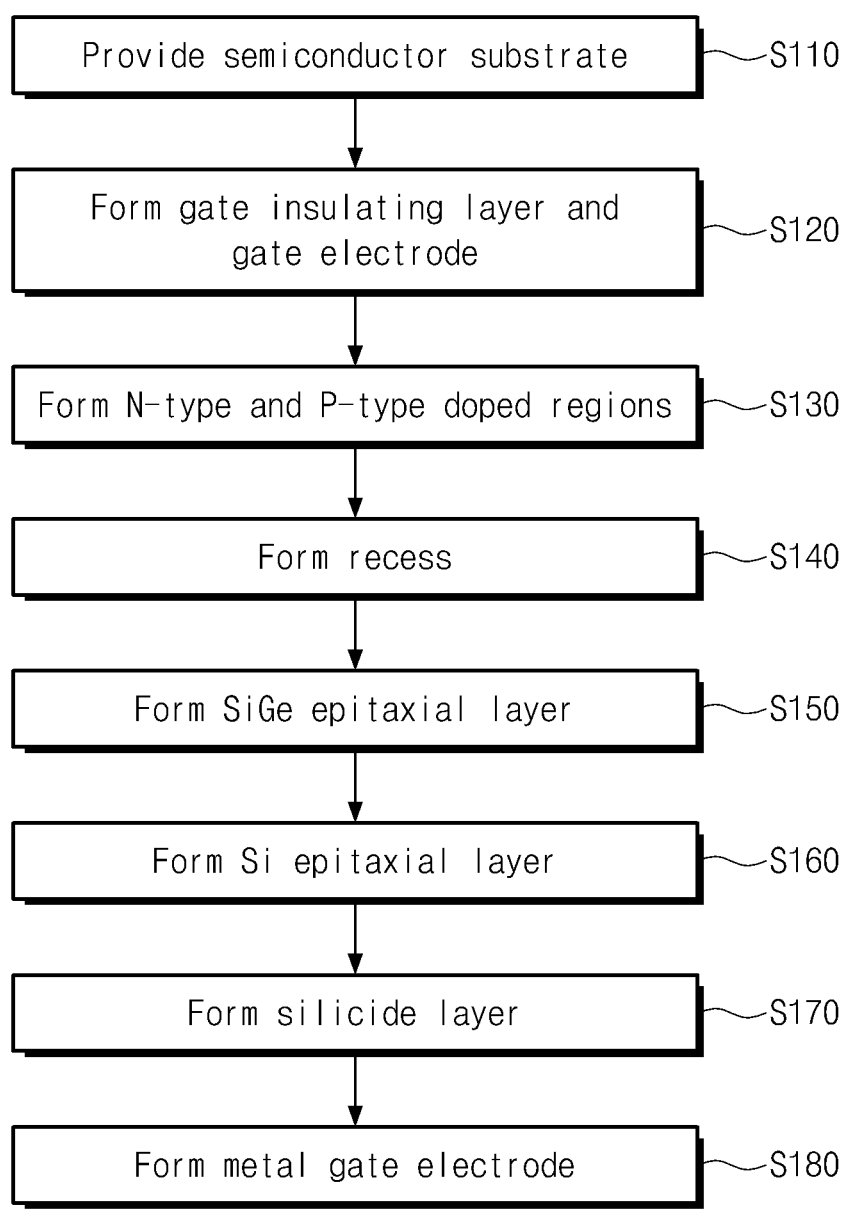
FIG. 30 is a flow chart of a sixth embodiment of a method of fabricating a semiconductor device according to the inventive concepts.
Figure 31:
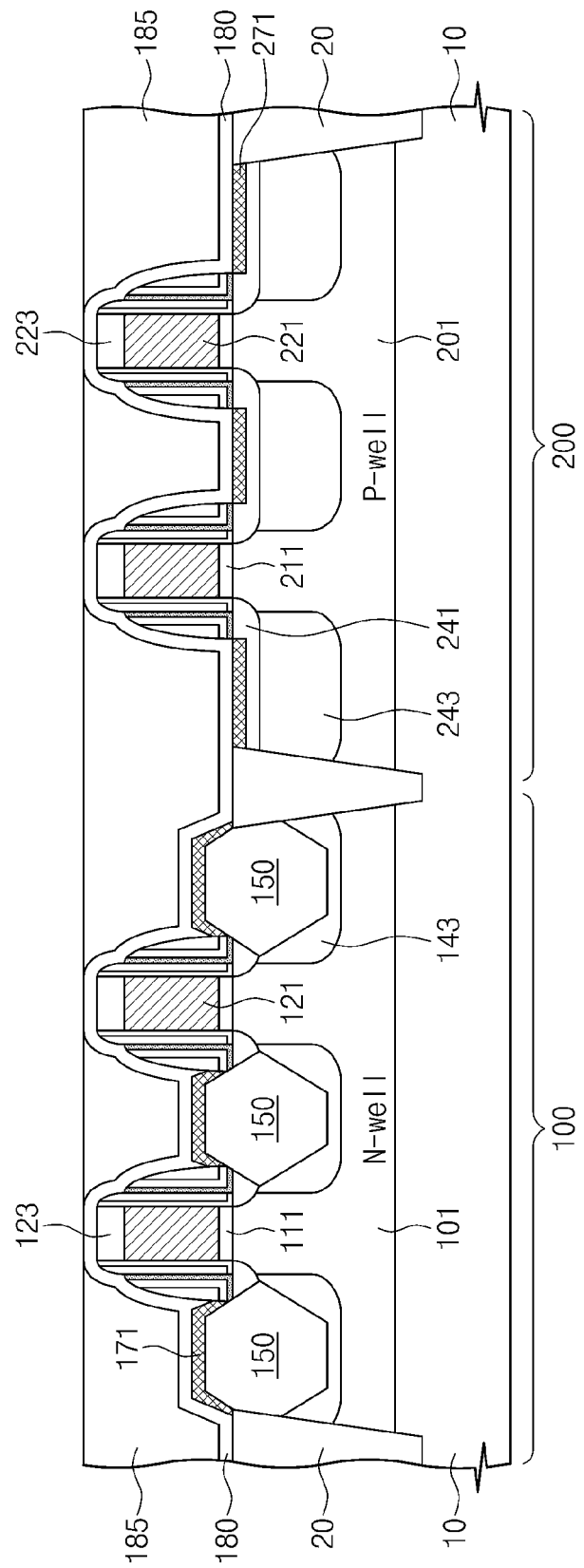
FIGS. 31 to 34 are each a sectional view and illustrate processes in the sixth embodiment of a method of fabricating a semiconductor device according to the inventive concepts.

Referring to FIGS. 30 and 31, a metal layer is conformally formed on the entirety of the first and second regions 100 and 200 of the substrate 10, and a thermal treatment process is performed on the resulting structure. As a result, the metal layer reacts with the Si epitaxial layer and the n-type doped regions. At this time, a silicide layer is not formed on the first and second gate electrodes 121 and 221 because the first and second capping patterns 123 and 223 are interposed between the metal layer and the first and second gate electrodes 121 and 221. Accordingly, silicide layers are formed only on the source/drain regions of the NMOS and PMOS transistors.

An etch stop layer 180 and an interlayer dielectric 185 are then sequentially formed as described with reference to FIG. 9. In this embodiment, the interlayer dielectric 185 may be formed to such a thickness as to cover the first and second gate electrodes 121 and 221, and then is planarized.

Figure 32:
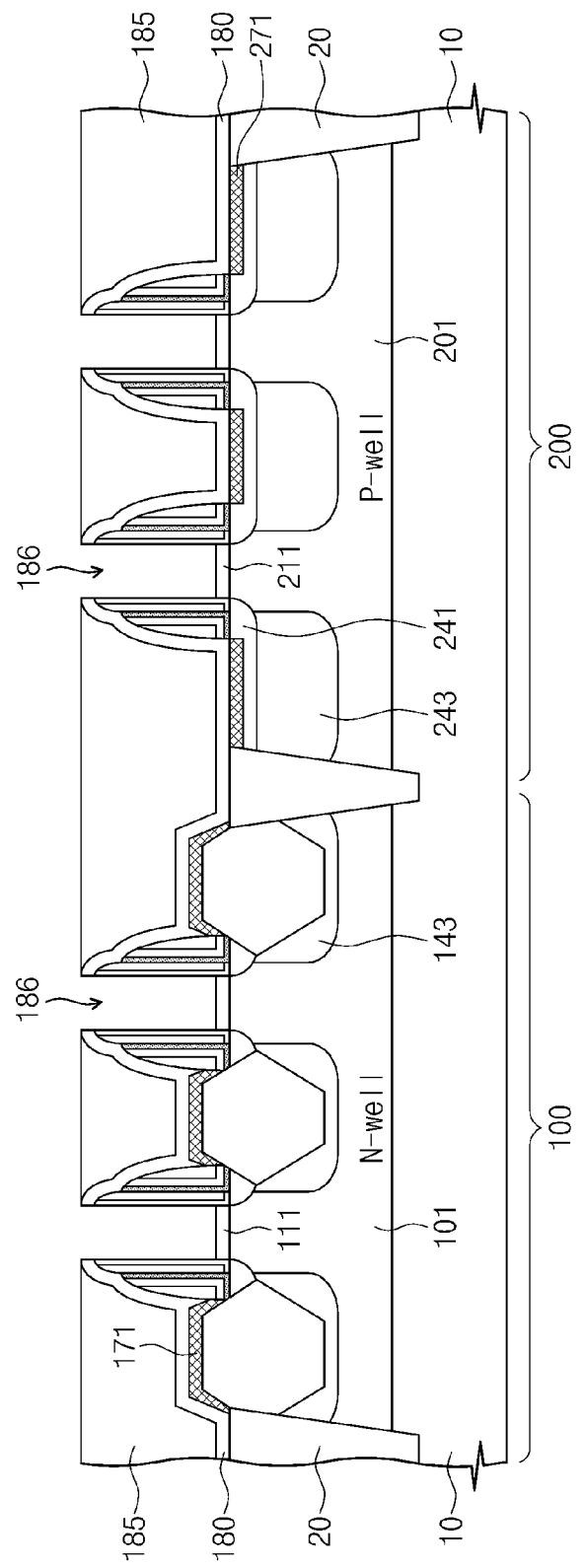

Referring to FIG. 32, the first and second capping patterns 123 and 223 and the first and second gate electrodes 121 and 221 are then removed to form openings 186 that expose first and second gate insulating layers 111 and 211. The first and second gate electrodes 121 and 221 can be removed by a wet etching process using an etchant having an etch selectivity with respect to first spacers 130a and 230a and the first and second gate electrodes 121 and 221.

Figure 33:
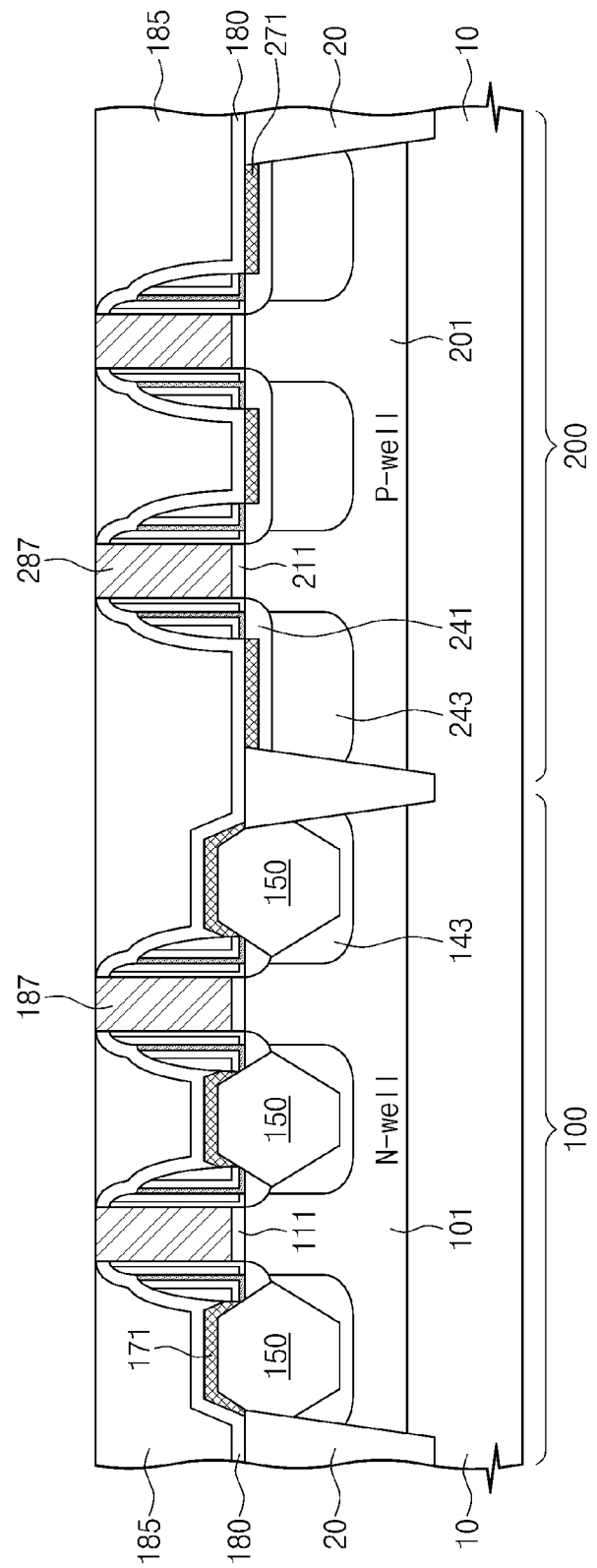

Referring to FIG. 33, metal gate electrodes 187 and 287 are formed in the openings 186. The forming of the metal gate electrodes 187 and 287 may include: forming a metal layer on the interlayer dielectric 185 to such a thickness as to overfill the openings 186 using a deposition process having good step coverage; and planarizing the metal layer to expose the interlayer dielectric 185. In this respect, the metal gate electrodes 187 and 287 may be formed of a metal layer and/or a metal nitride layer. Examples of the metal layers include aluminum, tungsten and molybdenum layers and examples of conductive metal nitride layers include titanium nitride, tantalum nitride, tungsten nitride, and titanium aluminum nitride layers. Also, a metal barrier layer may be formed on the sides of the opening before the metal layer has been formed to prevent the diffusion of the metal material of the layer. For example, the metal barrier layer may comprise a conductive metal nitride layer such as a tungsten nitride (WN) layer, a tantalum nitride (TiN) layer or a titanium nitride (TaN) layer.

Figure 34:
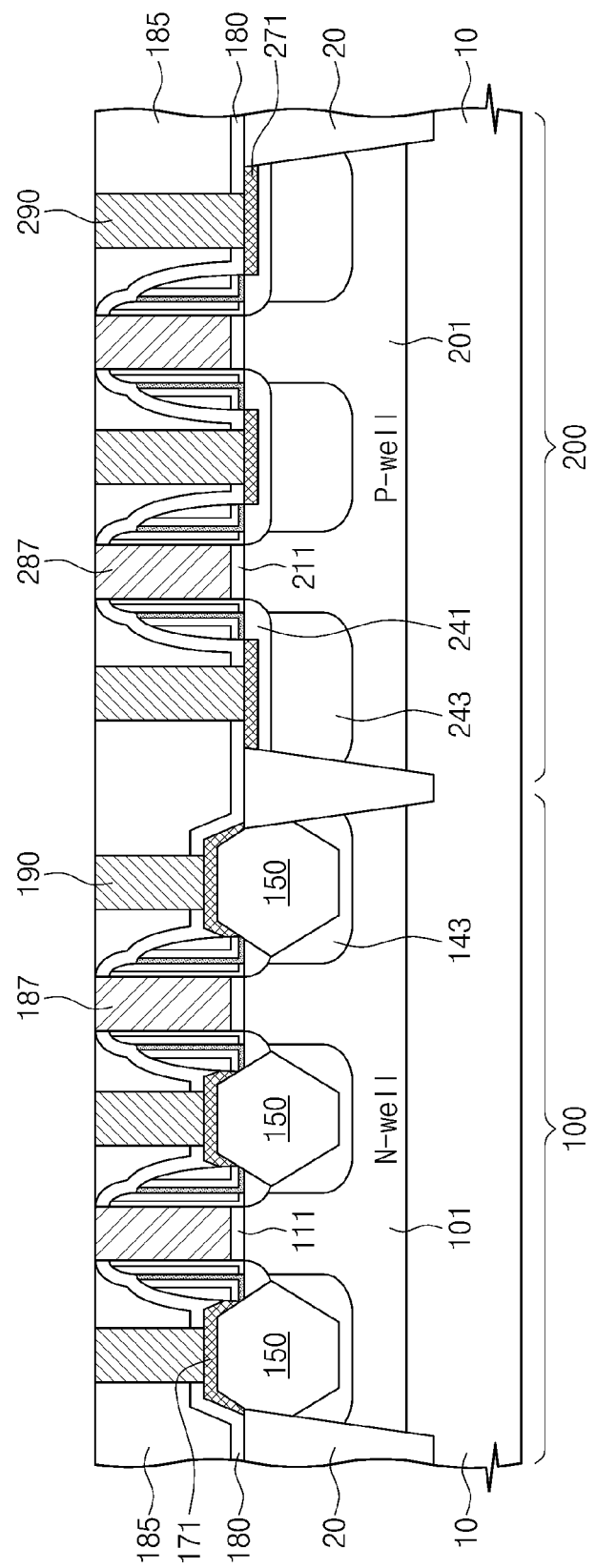

Contact plugs 190 and 290 connected to the silicide layers 171 and 271 are then formed as illustrated in FIG. 34.

Figure 35:
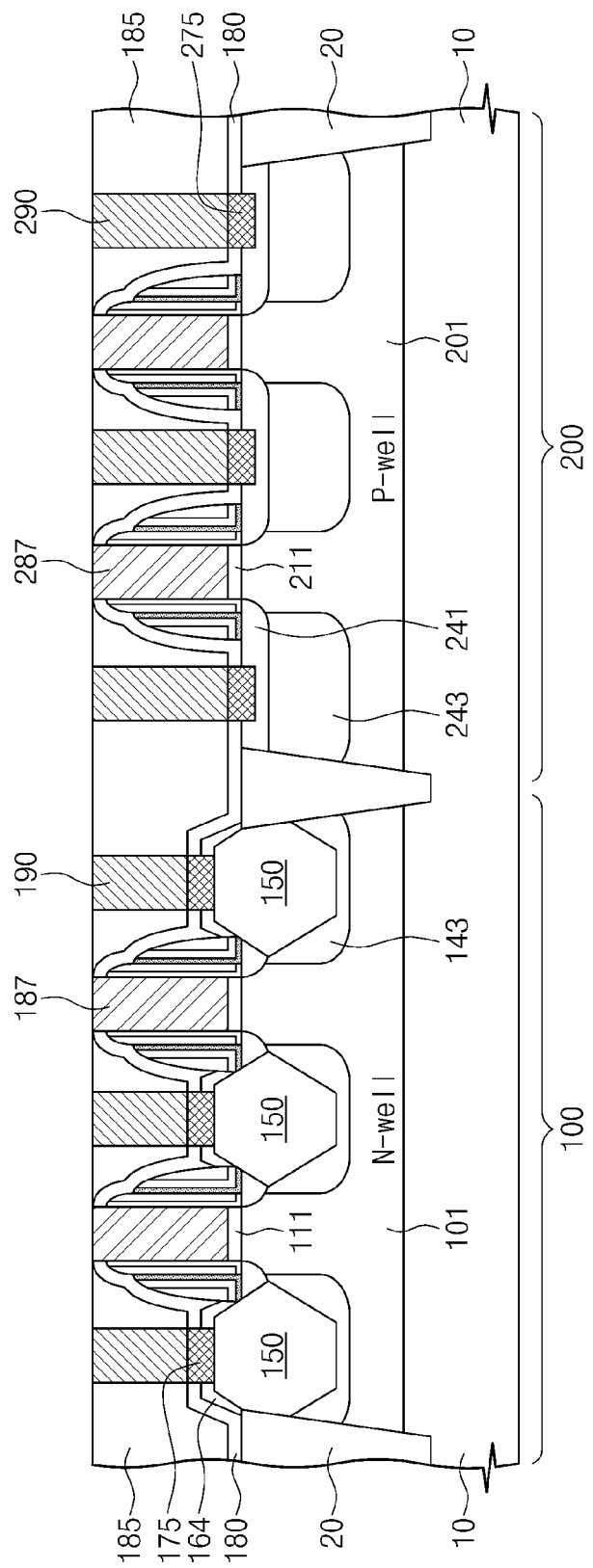
FIG. 35 is a sectional view of a process in another version of the sixth embodiment of a method of fabricating a semiconductor device according to the inventive concepts.

In another example of this embodiment, the silicide process is performed after the contact holes have been formed. Accordingly, as illustrated in FIG. 35, only that portion of the Si epitaxial layer exposed by a contact hole reacts with the metal layer to form silicide layers 175 and 275. That is, the silicide layers 175 and 275 are locally formed on the top surface 150t of the SiGe epitaxial layer 150 and on the n-type heavily-doped region 143, and an Si epitaxial layer remains on the inclined surfaces of the upper portion of the SiGe epitaxial layer 150.

PMOS transistors according to the inventive concepts may be used in a logic circuit. For example, the PMOS transistors may constitute a CMOS inverter or an SRAM.

Figure 36:
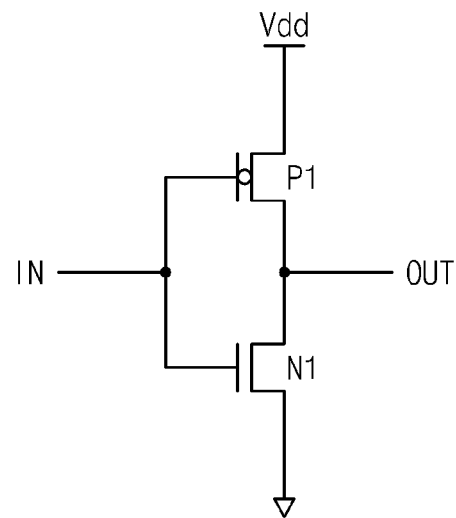
FIG. 36 is a circuit diagram of an inverter including a CMOS transistor according to the inventive concepts.

A CMOS inverter according to the inventive concepts will now be described with reference to the circuit diagram of FIG. 36.

The CMOS inverter includes a PMOS transistor P1 and an NMOS transistor N1. The PMOS and NMOS transistors are connected in series between a driving voltage terminal Vdd and a ground voltage terminal, and a common input signal is inputted to the gates of the PMOS and NMOS transistors. A common output signal is outputted from the drains of the PMOS and NMOS transistors. Also, a driving voltage is applied to the source of the PMOS transistor, and a ground voltage is applied to the source of the NMOS transistor. The CMOS inverter inverts an input signal IN and outputs the resulting signal as an output signal OUT. In other words, when a logic level '1' is inputted as the inverter input signal, a logic level '0' is outputted as the output signal. On the other hand, when a logic level '0' is inputted as the inverter input signal, a logic level '1' is outputted as the output signal.

Figure 37:
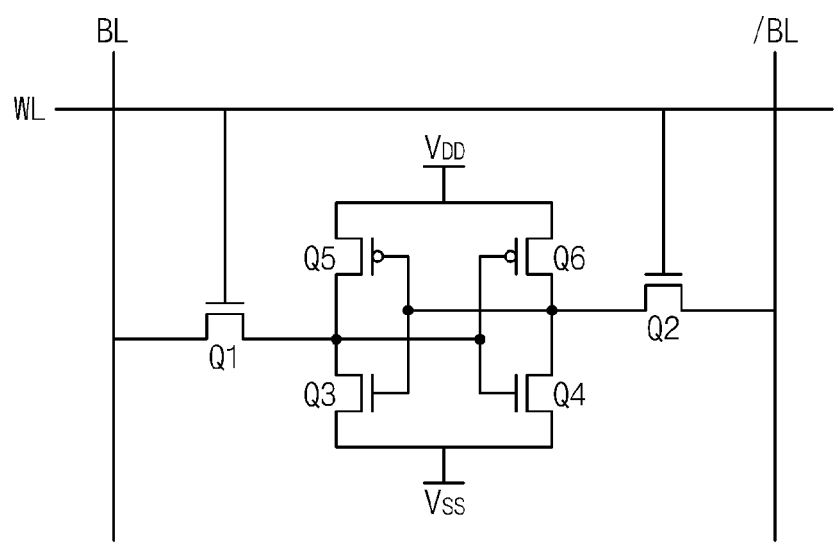
FIG. 37 is a circuit diagram of an SRAM device including a CMOS transistor according to exemplary embodiments of the inventive concepts.

An SRAM including a CMOS device according to the inventive concepts will now be described with reference to the circuit diagram of FIG. 37.

One cell in the SRAM includes first and second access transistors Q1 and Q2, first and second driving transistors Q3 and Q4, and first and second load transistors Q5 and Q6. The sources of the first and second driving (pull-up) transistors Q3 and Q4 are connected to a ground line VSS, and the sources of the first and second load (driver) transistors Q5 and Q6 are connected to a power line VDD.

The first driving transistor Q3 including an NMOS transistor and the first load transistor Q5 including a PMOS transistor constitute a first inverter. Likewise, the second driving transistor Q4 including an NMOS transistor and the second load transistor Q6 including a PMOS transistor constitute a second inverter.

The output terminals of the first and second inverters are connected to the sources of the first and second access transistors Q1 and Q2. Also, the input terminal of the first inverter and the output terminal of the second inverter are connected and conversely the input terminal of the second inverter and the output terminal of the first inverter are connected to constitute a latch circuit. The drains of the first and second access transistors Q1 and Q2 are connected, respectively, to first and second bit lines BL and /BL.

As described above, according to the inventive concepts, an Si epitaxial layer is formed on both the top surface and inclined surface of the SiGe epitaxial layer despite the fact that the growth rate of silicon is dependent on the crystal plane of the underlying lattice on which the silicon is grown. Accordingly, the metal material of a metal layer used to form a silicide is prevented from reacting with the SiGe epitaxial layer. Also, the metal material is prevented from infiltrating along the boundary between the SiGe epitaxial layer and the device isolation layer in which case it would react with the semiconductor substrate.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A semiconductor device, comprising:
   a semiconductor substrate;
   a gate electrode structure comprising a gate electrode located on an upper surface of an active region of the semiconductor substrate;
   first and second epitaxial regions located in the active region at opposite sides of the gate electrode structure, respectively, each of the first and second epitaxial regions having a top surface parallel with the upper surface of the active region, and at least one inclined surface extending at a downward inclination from the top surface;
   an interlayer dielectric layer in which the gate electrode structure is disposed and covering the first and the second epitaxial regions, the interlayer dielectric layer having contact holes therein; and
   silicon layers interposed between the interlayer dielectric layer and the first and second epitaxial regions, the silicon layers contacting the inclined surfaces of the first and second epitaxial regions; and
   first and second silicide layers disposed in the contact holes in contact with the top surfaces of the first and second epitaxial regions, respectively, and
   wherein both of the first and second epitaxial regions comprise Si—X, where X is one of germanium and carbon, and
   wherein each of the first and second silicide layers is devoid of X, and both of the first and second silicide layers comprise Si—Y, where Y is a metal or metal alloy.

2. The semiconductor device of claim 1, wherein Y is nickel, and the first and second silicide layers comprise $Ni_xSi_{1-x}$, where ($0 \leq x \leq 1$).

3. The semiconductor device of claim 1, wherein X is germanium, and the semiconductor device is a PMOS device.

4. The semiconductor device of claim 1, wherein X is carbon, and the semiconductor device is an NMOS device.

5. The semiconductor device of claim 1, wherein the first and second epitaxial regions protrude above an upper surface of the active region.

6. The semiconductor device of claim 1, wherein an obtuse angle is subtended by the top surface and the inclined surface.

7. The semiconductor device of claim 1, further comprising dielectric spacers covering the silicon layers, respectively.

8. The semiconductor device of claim 1, wherein the substrate has a well including a channel region located beneath the gate electrode structure, and impurity regions which isolate the epitaxial regions from the channel region.

9. The semiconductor device of claim 8, wherein the well is an N-well and the impurity regions comprise LDD structures.

10. The semiconductor device of claim 1, wherein the semiconductor device is a PMOS device and each of the epitaxial regions also has an inclined side surface located below the upper surface of the active region and adjacent a side of the gate electrode structure, the inclined side surface extending downwardly at an inclination away from the gate electrode structure so as to lie in a plane that subtends an obtuse angle with the upper surface of the active region.

11. The semiconductor device of claim 10, wherein the inclined surface which extends at a downward inclination from the top surface of each of the epitaxial regions adjoins the inclined side surface of the epitaxial region at a location beneath the upper surface of the active region.

12. The semiconductor device of claim 1, further comprising a device isolation layer in the substrate and which demarcates the active region, and wherein the inclined surface which extends at a downward inclination from the top surface of each of the epitaxial regions adjoins the device isolation layer.

13. A semiconductor device, comprising:
a substrate including a first region and a second region;
a device isolation layer in the substrate and which demarcates a first active region in the first region of the substrate and a second active region in the second region of the substrate;
a PMOS transistor disposed at the first region of the substrate, the PMOS transistor comprising a first gate electrode located on an upper surface of the first active region,
first and second epitaxial regions located in the first active region at opposite sides of the first gate electrode, respectively, and first and second silicide layers,
wherein each of the first and second epitaxial regions has a top surface parallel with the upper surface of the active region, and at least one inclined surface extending at a downward inclination from the top surface, and
wherein both of the first and second epitaxial regions comprise SiGe;
an interlayer dielectric layer in which the gate electrode structure is disposed and covering the first and the second epitaxial regions, the interlayer dielectric layer having contact holes therein,
wherein the first and second silicide layers are disposed in the contact holes in contact with the top surfaces of the first and second epitaxial regions, respectively, and
wherein each of the first and second silicide layers is devoid of germanium, and both of the first and second silicide layers comprise Si—Y, where Y is a metal or metal alloy;
silicon layers interposed between the interlayer dielectric layer and the first and second epitaxial regions, the silicon layers contacting the inclined surfaces of the first and second epitaxial regions; and
an NMOS transistor disposed at the second region of the substrate and electrically connected to the PMOS.

14. The semiconductor device of claim 13, wherein Y is nickel, and the first and second silicide layers comprise $Ni_x Si_{1-x}$, where ($0 \le x \le 1$).

15. The semiconductor device of claim 13, wherein the first and second epitaxial regions protrude above the upper surface of the first active region.

16. The semiconductor device of claim 14, wherein an obtuse angle is subtended by the top surface and the inclined surface.

17. The semiconductor device of claim 13, wherein the NMOS transistor comprises a second gate electrode located on the second active region of the semiconductor substrate,
third and fourth epitaxial regions located in the second active region at opposite sides of the second gate electrode, respectively, the third and fourth epitaxial regions of the NMOS transistor both comprising SiC, and
third and fourth silicide layers on upper surfaces of the third and fourth epitaxial regions, respectively, wherein at least a portion of each of the third and fourth silicide layers is devoid of carbon and comprises Si—Y, where Y is a metal or metal alloy.

* * * * *